(12) United States Patent
Arimoto et al.

(10) Patent No.: US 6,377,483 B1
(45) Date of Patent: Apr. 23, 2002

(54) SEMICONDUCTOR MEMORY DEVICE HAVING IMPROVED MEMORY CELL AND BIT LINE PITCH

(75) Inventors: Kazutami Arimoto; Hiroki Shimano; Toshinori Morihara, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/769,416

(22) Filed: Jan. 26, 2001

(30) Foreign Application Priority Data

Jul. 28, 2000 (JP) .................................... 2000-228580 P

(51) Int. Cl.7 ............................................... G11C 11/24
(52) U.S. Cl. .............................. 365/149; 365/51; 365/63
(58) Field of Search ........................... 365/149, 51, 63, 365/230.03, 230.06, 207, 72, 190

(56) References Cited

U.S. PATENT DOCUMENTS

| | | | | | |
|---|---|---|---|---|---|
| 5,315,542 A | * | 5/1994 | Melzner | ...................... | 365/72 |
| 5,396,452 A | * | 3/1995 | Wahlstrom | .................. | 365/149 |
| 5,966,315 A | * | 10/1999 | Muller | ......................... | 365/51 |
| 6,002,636 A | * | 12/1999 | Tsuchida et al. | ....... | 365/230.06 |

FOREIGN PATENT DOCUMENTS

| | | | | |
|---|---|---|---|---|
| JP | 357111061 A | * | 7/1982 | ........... G11C/11/34 |
| JP | 59-125652 | | 7/1984 | |

* cited by examiner

Primary Examiner—David Nelms
Assistant Examiner—David Lam
(74) Attorney, Agent, or Firm—McDermott, Will & Emery

(57) ABSTRACT

Tow bit lines are arranged in each column in which memory cells are disposed. For selecting a first group sub-word line, only a sense amplifier on one sense amplifier band is activated and for selecting a second group sub-word line, only a sense amplifier on the other sense amplifier band is activated. A storage node is formed under a bit line.

10 Claims, 23 Drawing Sheets

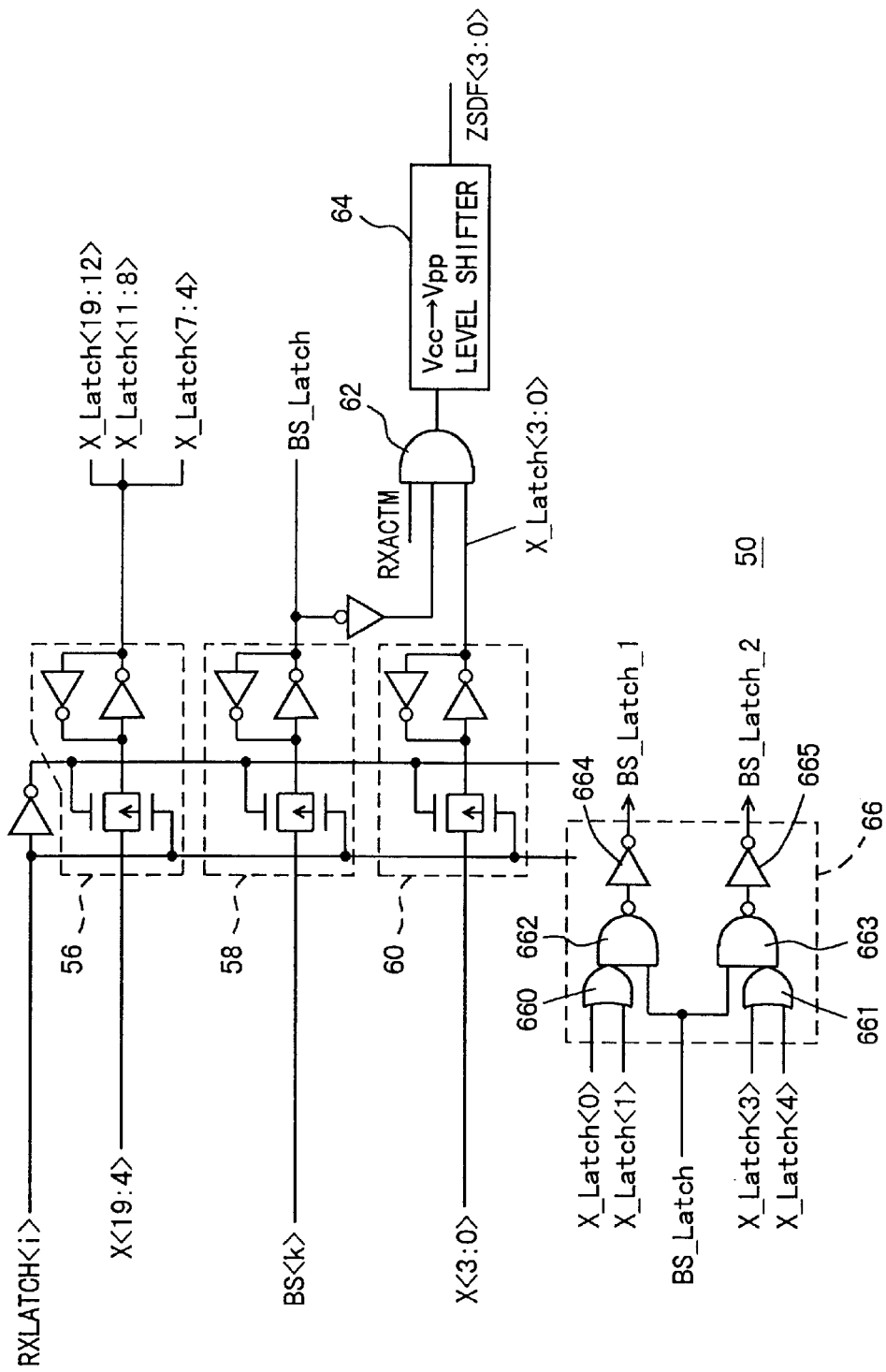
F I G. 6

SEMICONDUCTOR MEMORY DEVICE HAVING IMPROVED MEMORY CELL AND BIT LINE PITCH

BACKGROUND OF THE INVENTION

1. Field of the Invention

The present invention relates to a semiconductor memory device and, more particularly, to a system LSI mounted with memories.

2. Description of the Background Art

System LSIs have been developed such as a DRAM with a logic in which a logic such as a processor or ASIC (IC for specific purpose) and a dynamic random access memory (DRAM) having a large storage capacity are integrated on the same semiconductor chip (semiconductor substrate). In such a system LSI, connecting a logic and a memory such as a DRAM to each other by an internal data bus of as many as 128 to 512 bits realizes data transfer rate higher than a general-purpose DRAM by one digit or more digits.

The DRAM and the logic are connected by an internal wiring whose length is shorter enough than a board wiring and whose parasitic impedance is small, which enables drastic reduction of charging and discharging currents of the data bus and enables high-speed signal transmission. In addition, because of the connection between the logic and the DRAM by an internal wiring, the number of external pin terminals of the logic can be decreased to be less than that of a system in which a general-purpose DRAM is externally attached to a logic.

For these reasons, system LSIs such as a DRAM with a logic largely contribute improvement in performance of information apparatuses for executing such processing of handling a large volume of data as three-dimensional graphic processing, and image and voice processing.

FIG. 20 is a diagram schematically showing a structure of a conventional DRAM-embedded system LSI 900. With reference to FIG. 20. the system LSI 900 includes a large-scale logic LG coupled to an external pin terminal group LPGA for executing processing instructed, an analog core ACR coupled between the large-scale logic LG and an external pin terminal group APG for executing processing with respect to an analog. signal, a DRAM core MCR coupled to the large-scale logic LG through an internal wiring for storing data required by the large-scale logic LG, and a test interface circuit TIC for cutting off the large-scale logic LG and the DRAM core MCR, as well as coupling an external memory tester to the DRAM core MCR through a test pin terminal group TPG at the test mode. The DAM core MCR receives a power supply voltage VCC through a power supply pin terminal PST.

The analog core ACR includes a phase locked loop circuit (PLL) for generating an internal clock signal, an analog-digital converter for converting an external analog signal into a digital signal, and a digital-analog converter for converting a digital signal applied from the large-scale logic LG into an analog signal and outputting the analog signal.

FIG. 21 is a schematic sectional view of a DRAM core MCR and a large-scale logic LG manufactured by the DRAM-logic merging process. With reference to FIG. 21, on the surface of a semiconductor substrate 902, an N channel MOS transistor 906 and a P channel MOS transistor 908 electrically isolated from each other by a trench isolation 904 are formed. A gate electrode layer 910 is made of a material containing, for example, impurity-doped polycrystalline silicon (doped polysilicon) or silicon such as polycide including WSix. An interlayer insulation film 912 is formed over the surface so as to cover the MOS transistors 906 and 908. On the interlayer insulation film 912, a bit line layer 914 is formed for forming a bit line in the DRAM core MCR. An interlayer insulation film 916 is formed over the surface so as to cover the bit line layer 914. On the interlayer insulation film 916, an interlayer insulation film 918 is formed. On the interlayer insulation film 918, metal wiring layers 920 to 922 and interlayer insulation films 924 to 926 are formed alternatively. The metal wiring layers 920 to 922 are made of, for example, a metal such as aluminum (Al) or an alloy containing aluminum and copper (Cu). The first metal wiring layer 920 is electrically connected to the bit line layer 914 by a plug 918b which is formed by plugging tungsten (W) etc. into a contact hole 918a. The second metal wiring layer 921 and the third metal wiring layer 922 are electrically connected to the metal wiring layers 920 and 921 by plugs 924b and 925b which are formed by plugging tungsten (W) etc. into through holes 924a and 925a, respectively. In a complete CMOS logic process with no DRAM mounted, the above-described bit line layer 7 (914) is unnecessary.

FIG. 22 is a layout diagram showing a schematic structure of a memory cell array in the DRAM core MCR illustrated in FIG. 20. A plurality of sub-memory arrays SMA illustrated in FIG. 22 are disposed in the row direction (horizontal direction in FIG. 22) to constitute a sub-block. A plurality of sub-blocks are disposed in the column direction (vertical direction in FIG. 22) to constitute the entire memory cell array. The memory cell array has a so-called "hierarchical word line" (also called "divided word line") structure in which a main word line MWL and a sub-word line SWL are arranged. Also bit line pairs BL, ZBL are arranged to intersect with these sub-word lines SWL. The bit line pair BL, ZBL has a folded bit line structure having a high noise-tolerance. The bit line pair BL, ZBL is connected to a sense amplifier S/A arranged in a sense amplifier band SAB. The sub-word line SWL is connected to a sub-word driver SD arranged in a sub-word driver band SDB.

At a crossover point between the sub-word line SWL and the bit line BL or ZBL, a memory cell MC is formed. Each memory cell MC is made up of an access transistor and a storage capacitor. At two memory cells MC adjacent to each other, the bit line BL or ZBL is connected to two access transistor field regions 932 through a shared bit line contact 930. At each memory cell MC, a storage node is connected to the field region 932 of the access transistor through a storage node contact 934. Here, projecting a minimum pitch length of the memory cell MC obtained by obliquely linking the bit line contacts 930 in the bit line direction results in having a length half an arrangement pitch of the memory cell MC in the bit line direction, which memory cell arrangement is referred to as "half-pitch cell" (also called "½ pitch cell").

FIG. 23 is a schematic sectional view of the sub-memory cell array SMA and the sub-word driver band SDB shown in FIG. 22. As illustrated in FIG. 23, on the surface of the semiconductor substrate 902, N or P channel MOS transistors 940 and 942 are formed. The transistor 940 forms the access transistor of the memory cell MC and the transistor 942 forms the sub-word driver SD. The sub-word line SWL is formed in the gate layer 910. The bit line BL and a configuration dummy bit line DBL are formed in the bit line layer 914. A capacitor 944 of the memory cell MC is formed between the interlayer insulation films 916 and 918. The capacitor 944 is made up of a storage node 946 and a cell plate electrode 936. The capacitor 944 is formed over the bit line BL to make a so-called COB (Capacitor Over Bit line)

structure. Therefore, the storage node 946 between the adjacent bit lines serves as a shield to further enhance a noise-tolerance. The capacitor 944 is of a stack type for ensuring a capacity and has a complicated three dimensional structure in which the storage node 946 is formed to be a tall cylinder and the surface is made rough although it is not shown in order to further enlarge a capacitor area. As a result, a large step is generated between the memory cell array and the remaining peripheral circuits to make narrowing of a wiring pitch of the metal wiring layers 920 to 922 difficult. Under these circumstances, the above-described step is drastically reduced by the introduction of a planarization process using CMP (Chemical Mechanical Polishing).

Thus, the system LSI with the DRAM further needs, in addition to an ordinary CMOS logic process, a process step for forming the capacitor 944 of the DRAM core MCR having a complicated three dimensional structure and a planarization process step for reducing a step derived from the capacitor 944 having a three dimensional structure, causing an increase in chip costs because of drastic increase in the number of process steps.

On the other hand, there is an SRAM as a memory with a logic which can be formed by a complete CMOS logic process. Although SRAM had been used as a cache memory, a register file memory or the like for a processor, it has been widely used as a main memory in a portable information terminal and the like whose down-sizing is very stringently demanded in order to simplify a system structure. This is because DRAM requires refreshing operation and requires such complicated memory control operation related to refreshing as waiting an access to a memory being refreshed until a refresh cycle ends. Recent portable information terminals need a memory having a large capacity because their functions are drastically improved to handle even moving picture. As to a DRAM, memory size has been reduced with the advancement of fine fabrication process. The 0.18 $\mu$m DRAM process, for example, realizes a cell size of 0.3 square $\mu$m. On the other hand, in an SRAM in which a memory cell is composed of six P and N channel MOS transistors, even though fine fabrication process is improved, reduction in a memory size can not be so enchanted as compared with a DRAM because of constraints on an isolation distance between a P-type well and an N-type well etc. A memory size of an SRAM obtained by a 0.18 $\mu$m CMOS logic process is approximately 7 square $\mu$m which is more than 20 times a memory size of a DRAM. Thus, as to SRAM, its chip size is drastically increased as a capacity is increased, so that mounting an SRAM of not less than 4 megabits together with a logic is extremely difficult.

FIGS. 3 and 4 of Japanese Patent Laying-Open No. 59-125652, illustrate stack-type memory cells C0 to C3 and a folded bit line pair BL0, /BL0. The memory cell has a CUB (Capacitor Under Bitline) structure in which a capacitor (6, E0, E1) is formed under the bit line BL0. Here, in each column where memory cells are arranged, one bit line is disposed. In other words, a memory cell pitch and a bit line pitch are the same.

SUMMARY OF THE INVENTION

An object of the present invention is to provide a semiconductor memory device of a large capacity whose size is not so small as that of an ordinary DRAM but smaller enough than an SRAM.

A semiconductor memory device according to the present invention includes a plurality of memory cells arranged in rows and columns and a plurality of first and second folded bit line pairs arranged in the columns. Field region of an access transistor of a memory cell arranged in each column is formed on the straight line in the column. Two bit lines of the folded bit line pair are formed in parallel to each other in each column. The above-described memory cell preferably includes a capacitor formed under the folded bit line pair. More preferably, the above-described semiconductor memory device further includes a plurality of first word lines, a plurality of second word lines, a plurality of first sense amplifiers, a plurality of second sense amplifiers and a control means. The plurality of first word lines are connected to memory cells connected to the first folded bit line pairs. The plurality of second word lines are connected to memory cells connected to the second folded bit line pairs. The plurality of first sense amplifiers are arranged so as to correspond to the plurality of first folded bit line pairs on one side of the plurality of first and second folded bit line pairs. Each of the first sense amplifiers is connected to its corresponding first folded bit line pair. The plurality of second sense amplifiers are arranged so as to correspond to the plurality of second folded bit line pairs on the other side of the plurality of first and second folded bit line pairs. Each of the second sense amplifiers is connected to its corresponding second folded bit line pair. The control means activates the first sense amplifier for selecting the first word line and activates the plurality of second sense amplifiers for selecting the second word line. More preferably, the above-described first and second folded bit line pairs are arranged alternately.

Preferably, the above memory cells and folded bit line pairs constitute each bank. The above first or second sense amplifier is shared by two adjacent banks.

Preferably, the above-described semiconductor memory device further includes a plurality of word lines and a plurality of first and second word drivers. The plurality of first word drivers are connected to one side of the plurality of word lines. The plurality of second word drivers are connected to the other side of the plurality of word lines.

Since two bit lines are arranged at a memory cell arrangement pitch in the semiconductor memory device, a small-sized memory having a large capacity can be realized without an increase in the number of manufacturing processes.

In addition, since only a sense amplifier arranged on one side of a folded bit line pair is activated and between bit line pairs whose voltages swing due to data reading, a bit line pair whose voltage will not swing exists, even a CUB structure obtains a noise-tolerance as high as that of a COB structure because of shielding by the latter bit line pair.

Moreover, since only a sense amplifier on one side of a bank is activated, a possibility of contention of bank accesses can be reduced.

Furthermore, since the word driver drives the word line from the opposite sides thereof, even a long word line can be driven quickly.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a circuit diagram showing a structure of the row local control circuit shown in FIG. 5.

DESCRIPTION OF THE PREFERRED EMBODIMENTS

Figure 1:
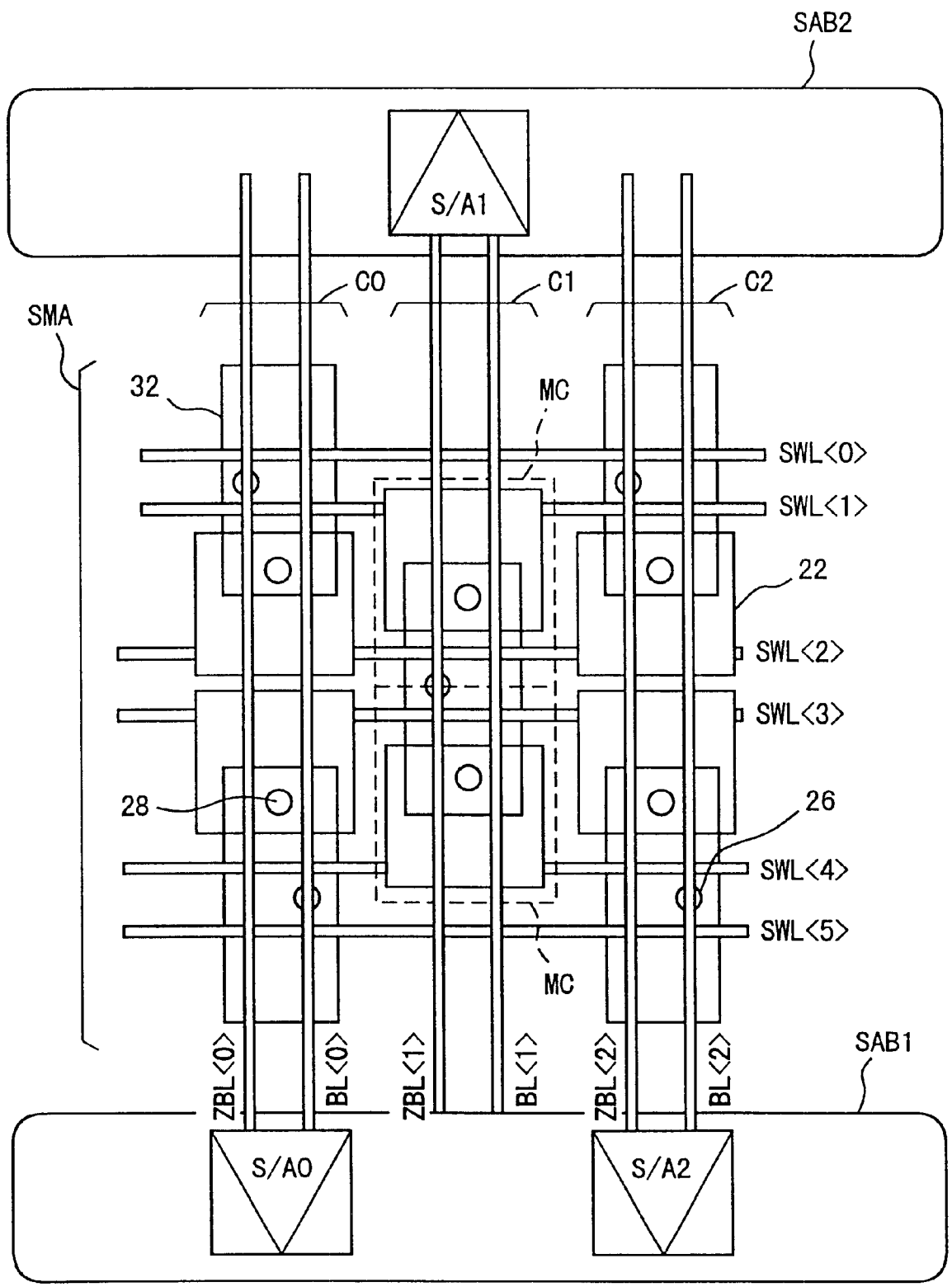
FIG. 1 is a layout diagram showing a structure of a sub-memory cell array and sense amplifier bands on the opposite sides thereof in a system LSI according to a first embodiment of the present invention.

In the following, embodiments of the present invention will be described in detail with reference to the drawings. In the drawings, the same or corresponding parts are indicated by the same reference numerals and no description thereof will be repeated.

[First Embodiment]

Figure 2:
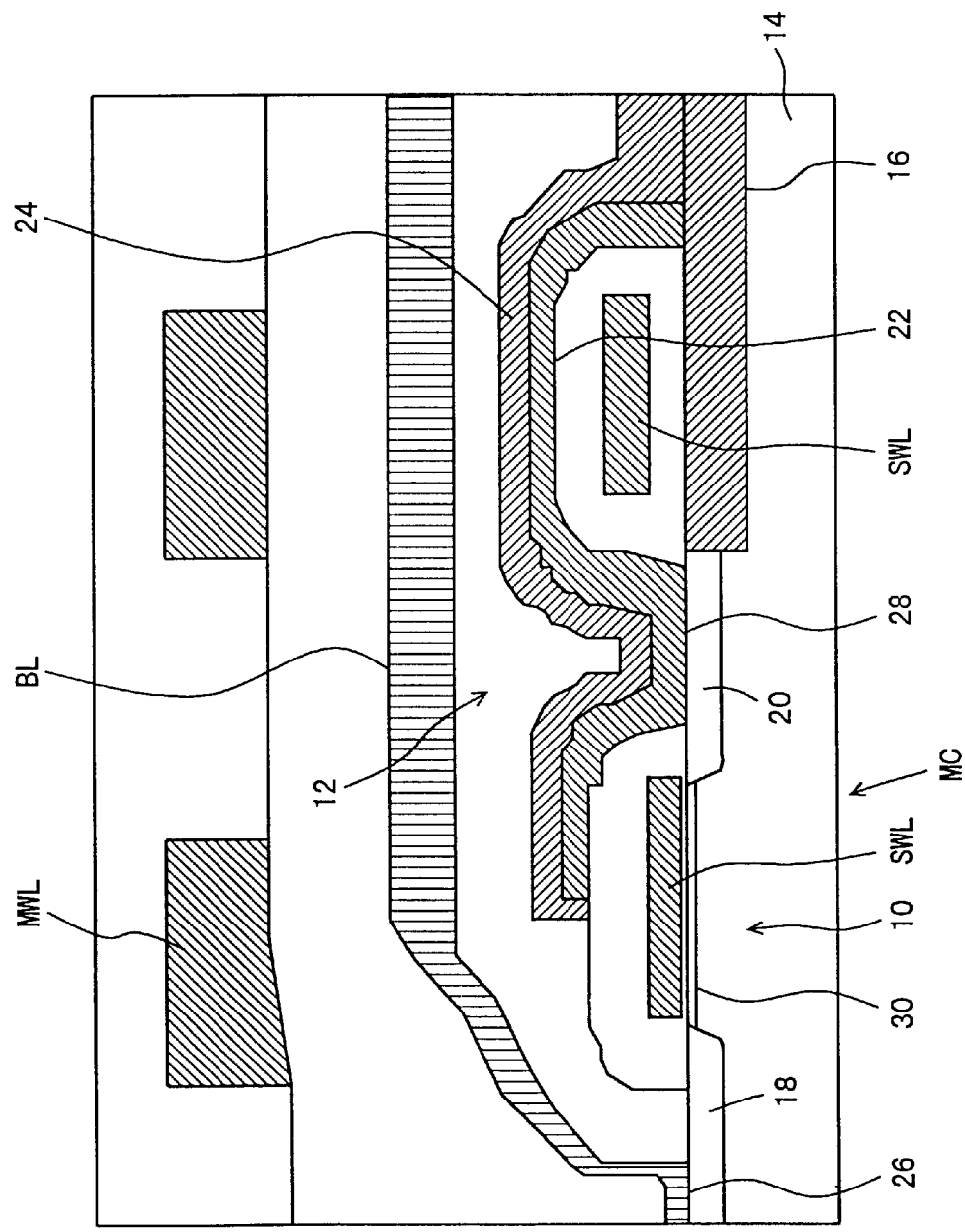
FIG. 2 is a sectional view taken along a bit line indicating a memory cell in FIG. 1.

FIG. 1 is a layout diagram showing a schematic structure of a portion of a sub-memory cell array and sense amplifier bands adjacent thereto on the opposite sides thereof in a DRAM core of a system LSI according to the first embodiment of the present invention. FIG. 2 is a sectional view showing a schematic structure of a memory cell taken along a bit line in FIG. 1.

As illustrated in FIG. 1, a plurality of memory cells MC are arranged in rows and columns of the sub-memory cell array. In the columns, a plurality of folded bit line pairs BL<0>, ZBL<0> to BL<2> and ZBL<2> are arranged and in the rows, a plurality of sub-word lines SWL<0> to SWL<5> are arranged. In each of columns C0 to C2, a plurality of memory cells MC are arranged approximately on a straight line and also in each column, a pair of bit lines BL and ZBL is arranged. Projecting a minimum pitch length of the memory cell MC obtained by obliquely linking bit line contacts 26 in the bit line direction results in having a length half a memory cell MC arrangement pitch in the bit line direction, which corresponds to "half-pitch cell" arrangement.

As illustrated in FIG. 2, each memory cell MC includes an access transistor 10 and a simple stack-type capacitor 12. The access transistor 10 is an N channel MOS transistor composed of source/drain regions ($N^+$ diffusion regions) 18 and 20 isolated by a trench isolation 16 on the surface of a semiconductor substrate 14, and a gate electrode made up of the sub-word line SWL. The capacitor 12 is composed of a storage node 22, a thin insulation film (not shown) formed thereon and a cell plate 24 formed further thereon.

The bit line BL is connected to the source/drain region 18 of the access transistor 10 by the bit line contact 26. The storage node 22 is connected to the source/drain region 20 of the access transistor 10 by a storage node contact 28. Here, the access transistors 10 of two adjacent memory cells MC share one source/drain region 18. The source/drain regions 18 and 20 of the access transistors 10 of the two adjacent memory cells MC and an N channel region 30 form one field region 32. The field regions 32 are formed on a straight line in each of the columns C0 to C2. The insulation film of the capacitor 12 is made of an oxide film or a high dielectric such as $Ta_2O_5$. Here, a CUB (Capacitor Under Bitline) structure is adopted in which the capacitor 12 is formed under the bit line BL.

Figure 23:
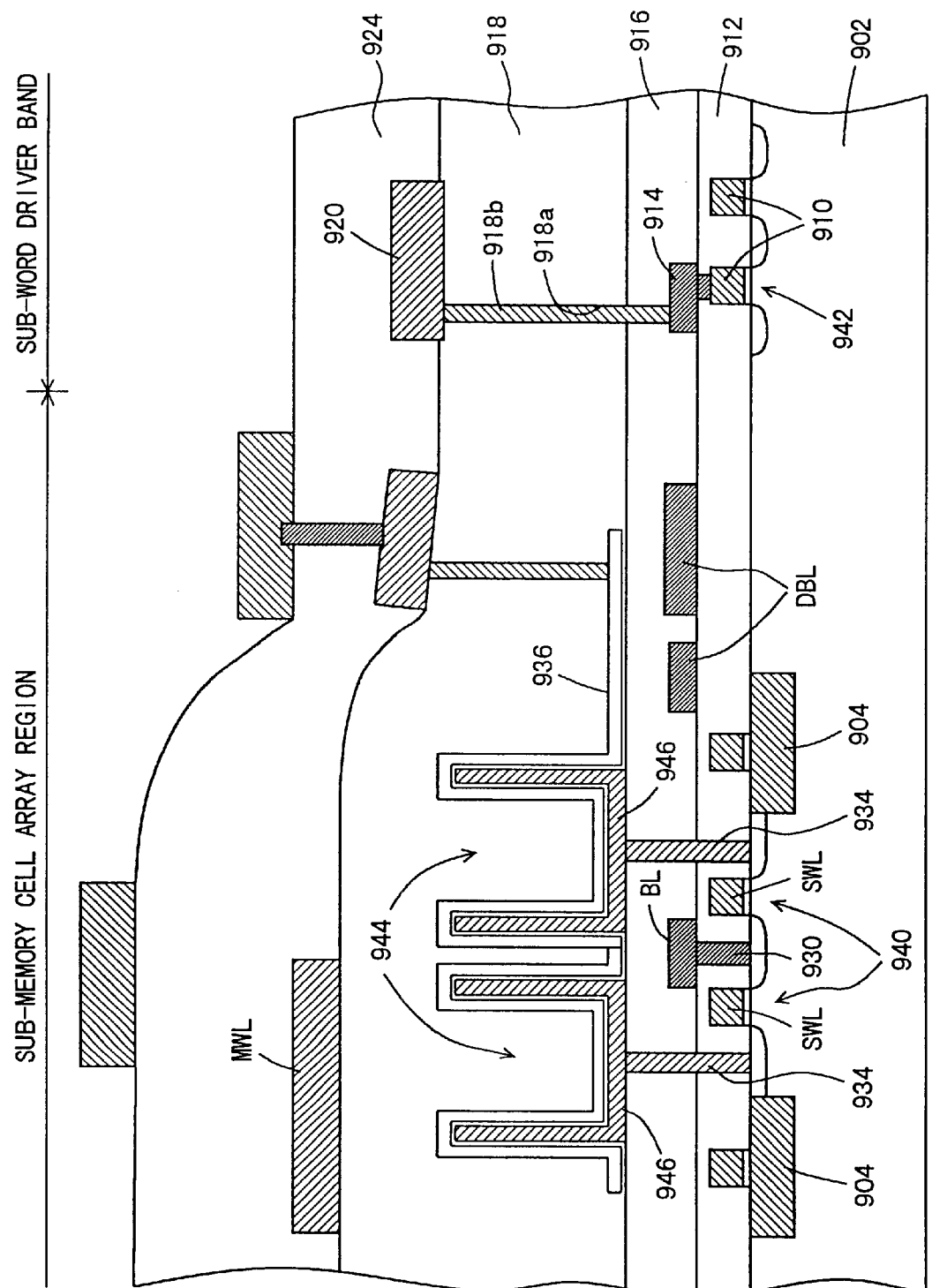
FIG. 23 is a sectional view showing a structure of the sub-memory cell array and the sub-word driver band illustrated in FIG. 22.

As described above, in the first embodiment, the size of the capacitor 12 of the memory cell MC in the first embodiment is increased in the word line direction such that two bit lines BL and ZBL can be arranged at an arrangement pitch of the memory cell MC in the word line direction. Since the memory cell MC thus has a simple stack-type capacitor 12, the number of process steps for forming the capacitor 12 can be decreased to be less than that of the memory cell MC of the conventional DRAM shown in FIG. 23. As a result, a step generated between the memory cell array and its peripheral circuits can be reduced to eliminate the need of introducing a planarization process such as CMP for abating steps.

Again with reference to FIG. 1, on the opposite sides of the sub-memory memory cell array SMA, sense amplifier bands SAB1 and SAB2 are arranged. The even-numbered bit line pairs BL<0>, ZBL<0>, and BL<2>, ZBL<2> are connected to sense amplifiers S/A0 and S/A2 on the sense amplifier band SAB1, respectively, through a bit line isolation gate (not shown). The odd-numbered bit line pair BL<1>, ZBL<1> is connected to a sense amplifier S/A1 on the sense amplifier band SAB2 through a bit line isolation gate (not shown). In this structure, for selecting the sub-word lines SWL<0>, SWL<1>, SWL<4> or SWL<5>, only the sense amplifiers on the sense amplifier band SAB1 need to be activated. For selecting the sub-word line SWL<2> or SWL<3>, only the sense amplifier on the sense amplifier band SAB2 needs to be activated.

Figure 3:
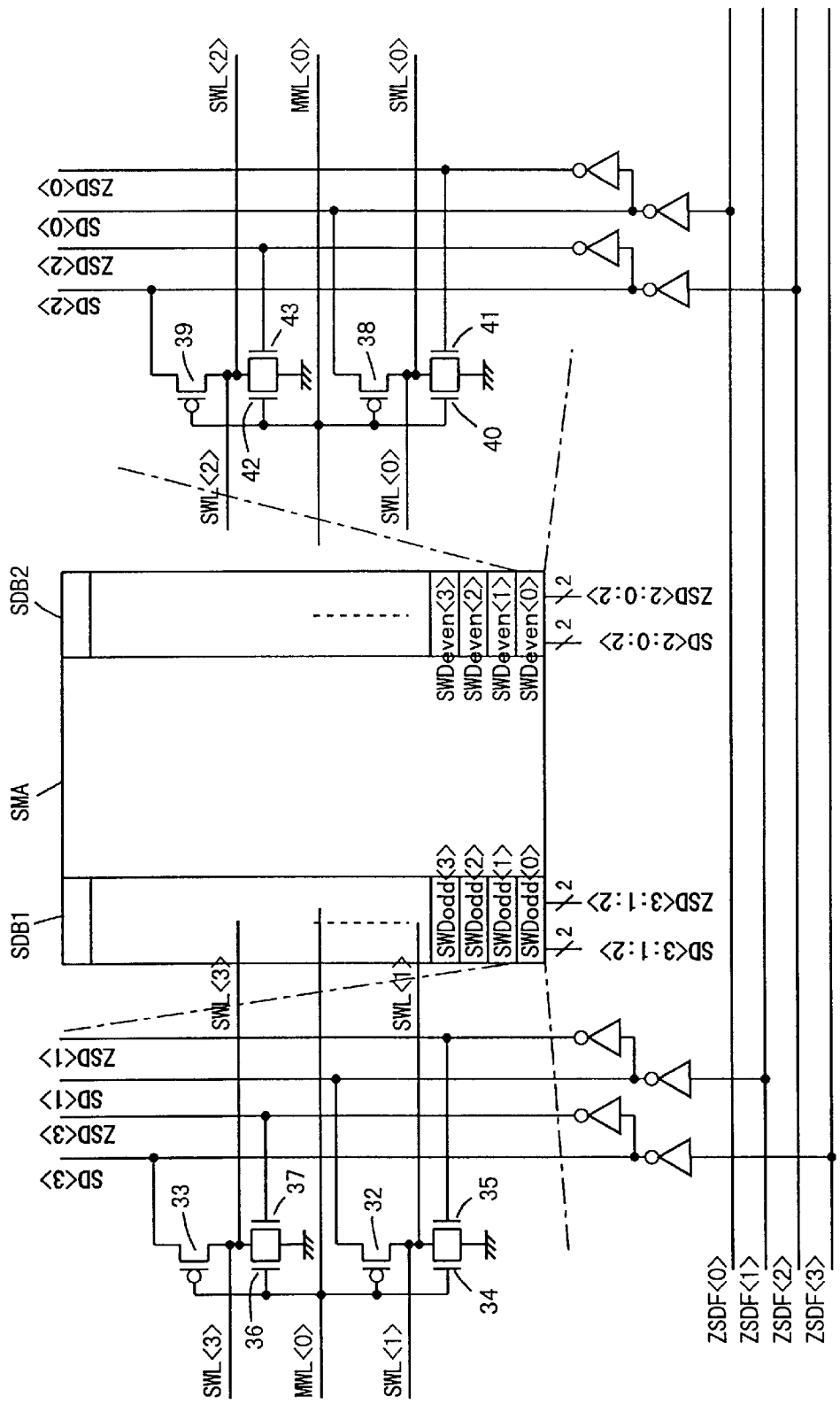
FIG. 3 is a circuit diagram showing the structure of the sub-memory array and the sense amplifier bands on the opposite sides thereof in the system LSI according to the first embodiment of the present invention.

FIG. 3 is a circuit diagram showing a structure of a sub-word driver in a four-way hierarchical word line structure. With reference to FIG. 3, on the opposite sides of the sub-memory cell array SMA, sub-word driver bands SDB1 and SDB2 are arranged. In the sub-word driver band SDB1, a plurality of sub-word drivers SWDodd<0>, SWDodd<1>, SWDodd<2> . . . are arranged each for driving two odd-numbered sub-word lines SWL extending from the opposite sides. Similarly in the sub-word driver band SDB2, a plurality of sub-word drivers SWDeven<0>, SWDeven<1>, SWDeven<2> . . . are arranged each for driving two even-numbered sub-word lines SWL extending from the opposite sides. The sub-word driver SWDodd<0> to SWDodd<3> are activated in response to SD<3:1:2> and ZSD<3:1:2> generated from a two-bit sub-decoding signal ZSDF<3:1:2>. The sub-word drivers SWDeven<0>, SWDeven<1>, SWDeven<2> . . . are activated in response to SD<2:0:2> and ZSD<2:0:2> generated from a two-bit sub-decoding signal ZSDF<2:0:2>.

The sub-word driver SWDodd<0> includes P channel MOS transistors 32 and 33 and N channel MOS transistors 34 to 37. The other sub-word drivers SWDodd<1>, SWDodd<2> and SWDodd<3> are structured similarly. The sub-word driver SWDeven<0> includes P channel MOS transistors 38 and 39 and N channel MOS transistors 40 to 43. The other sub-word drivers SWDeven<1>, SWDeven<2> and SWDeven<3> . . . are similarly structured. In a case of a four-way hierarchical word line structure, four sub-word lines are provided corresponding to each of the main word lines. For example, corresponding to a main word line ZMWL<0>, four sub-word lines SWL<0>, SWL<1>, SWL<2> and SWL<3> are provided. Here, two adjacent sub-memory cell arrays share a sub-word driver provided therebetween. Each sub-word driver is accordingly connected to corresponding two sub-word lines in an adjacent sub-memory cell array on its right side and corresponding two sub-word lines in an adjacent sub-memory cell array on its left side. For example, the sub-word driver SWDodd<0> is connected to the sub-word lines SWL<1> and SWL<3> in the adjacent sub-memory cell array SMA on the right side and further connected to the sub-word lines SWL<1> and SWL<3> in the adjacent sub-memory cell array (not shown) on the left side. Similarly, the sub-word driver SWDeven<0> is connected to the sub-word lines SWL<0> and SWL<2> in the adjacent sub-memory cell array SMA on the left side and further connected to the sub-word lines SWL<0> and SWL<2> in the adjacent sub-memory cell array (not shown) on the right side.

When ZSDF<0> or ZSDF<1> is to be selected from among sub-decoded signals ZSDF<0> to ZSDF<3>, signals SD<0> and ZSD<0>, or SD<1> and ZSD<1>, are selected to select the sub-word lines SWL<0>, SWL<1>, SWL<4> and SWL<5> in FIG. 1. On the other hand, when the sub-decoded signal ZSDF<2> or ZSDF<3> is to be selected, signals SD<2> and ZSD<2>, or SD<3> and ZSD<3>, are selected to select the sub-word lines SWL<2> and SWL<3> in FIG. 1. The sub-decoded signals ZSDF<0> to ZSDF<3> are selected by the least-significant bit of a row address signal and a block decoding signal, and when less-significant two bits of the row address signal are RA<1:0>= (00) or (01), the sub-decoding signal ZSDF<0> or ZSDF<1> is selected. When RA<1:0>=(10) or (11), the sub-decoded signal ZSDF<2> or ZSDF<3> is selected. In other words, the row local control circuit provides control such that at a sub-block selected by a block decoding signal, activation of the sense amplifier band SAB1 or the sense amplifier band SAB2 is selected according to less-significant two bits of a row address signal. The row local control circuit will be detailed later.

Since as described in the foregoing, when the sub-word lines SWL<0>, SWL<1>, SWL<4> and SWL<5> are to be selected, only the sense amplifiers on the sense amplifier band SAB1 are activated and none of the sense amplifier on the sense amplifier band SAB2 is activated, while voltages of the even-numbered bit line pairs BL<0>, ZBL<0>, and BL<2>, ZBL<2> are fully swung by the sense amplifiers S/A0 and S/A2, no voltage of the odd-numbered bit line pair BL<1>, ZBL<1> will be swung. On the other hand, when the sub-word lines SWL<2> and SWL<3> are to be selected, only the voltage of the odd-numbered bit line pair BL<l>, ZBL<1> will be fully swung by the sense amplifier S/A1, while no voltage of the even-numbered bit line pairs BL<0>, ZBL<0>, and BL<2>, ZBL<2> will be swung. Thus voltages of adjacent bit line pairs on the opposite sides of a bit line pair being sensed will not vary at any time, whereby the bit line pairs are shielded from each other. As a result, as high a noise-tolerance as that of the COB structure can be achieved even by the CUB structure.

In an ordinary DRAM, although a multi-bank structure using a shared sense amplifier arrangement in which a sense amplifier is shared by adjacent banks has an advantage of reducing a total area of sense amplifiers, it has a higher probability of contention of bank accesses than in a structure in which no sense amplifier is shared by adjacent banks because until precharging of a row read into a sense amplifier is completed, no access to an adjacent bank can be started.

Figure 4:
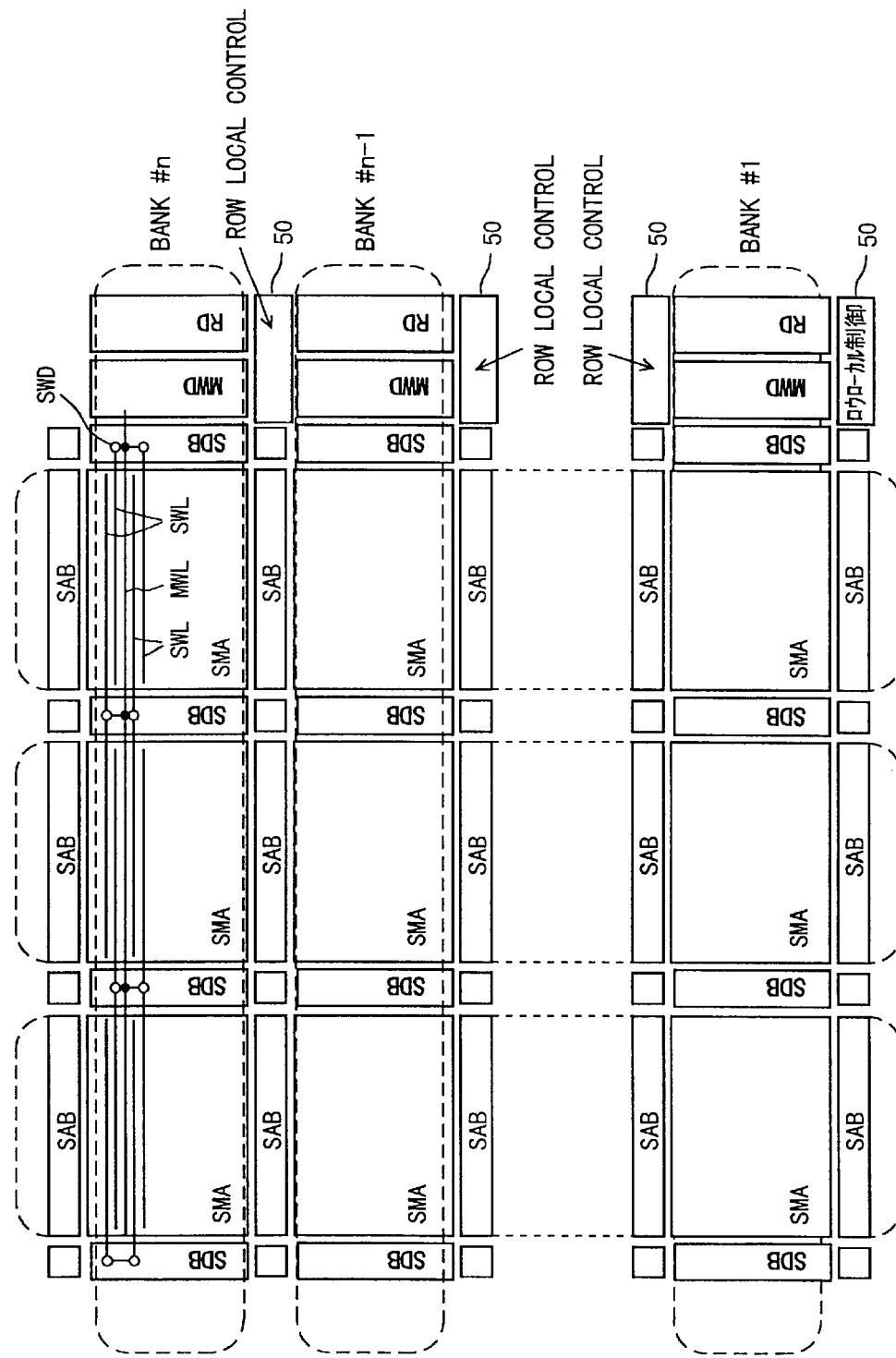
FIG. 4 is a layout diagram showing the entire structure of a memory cell array in the system LSI according to the first embodiment of the present invention.

FIG. 4 is a layout diagram showing an entire structure of the memory cell array according to the first embodiment of the present invention. With reference to FIG. 4, the memory cell array includes a plurality of sub-memory cell arrays SMA arranged in matrix. The plurality of sub-memory cell arrays SMA arranged in each row constitute one sub-bank. A plurality of sub-blocks constitute one bank or one sub-block allowing the number of banks to be maximum constitutes one bank. Here, according to the latter arrangement, the memory cell array is divided into a number n of banks #1 to #n. On the opposite sides of each sub-memory cell array SMA in the row direction, sub-word driver bands SDB are arranged and on the opposite sides in the column direction, the sense amplifier bands SAB are arranged. Over the plurality of sub-memory cell arrays SMA arranged in the row direction, a plurality of main word lines MWL are arranged. In each of the banks #1 to #n, a main word driver MWD for driving the plurality of main word lines MWL is arranged and a row decoder RD for selecting a main word line MWL to be driven is arranged.

Here, if the sense amplifier is not shared by the banks, a probability of contention of bank accesses will be 1/n the probability of accesses to the same bank. In the shared sense amplifier arrangement shown in FIG. 4 in which the sense amplifier is shared by the banks, with a probability of accesses to adjacent banks added to the above probability, a probability of contention for accesses to the bank will be 3/n, which is reduction in random access performance. In the case of the first embodiment, however, even when an adjacent bank is selected, contention of bank accesses will occur exclusively when the sub-word lines SWL<0>, SWL<1>, SWL<4> and SWL<5> are selected in the lower bank and the sub-word lines SWL<2> and SWL<3> are selected in the upper bank in FIG. 1. As a result, a probability of contention for accesses to the bank will be 3/(2n), which is half that in a simple shared sense amplifier arrangement, to suppress reduction in random access performance to some extent.

Figure 5:
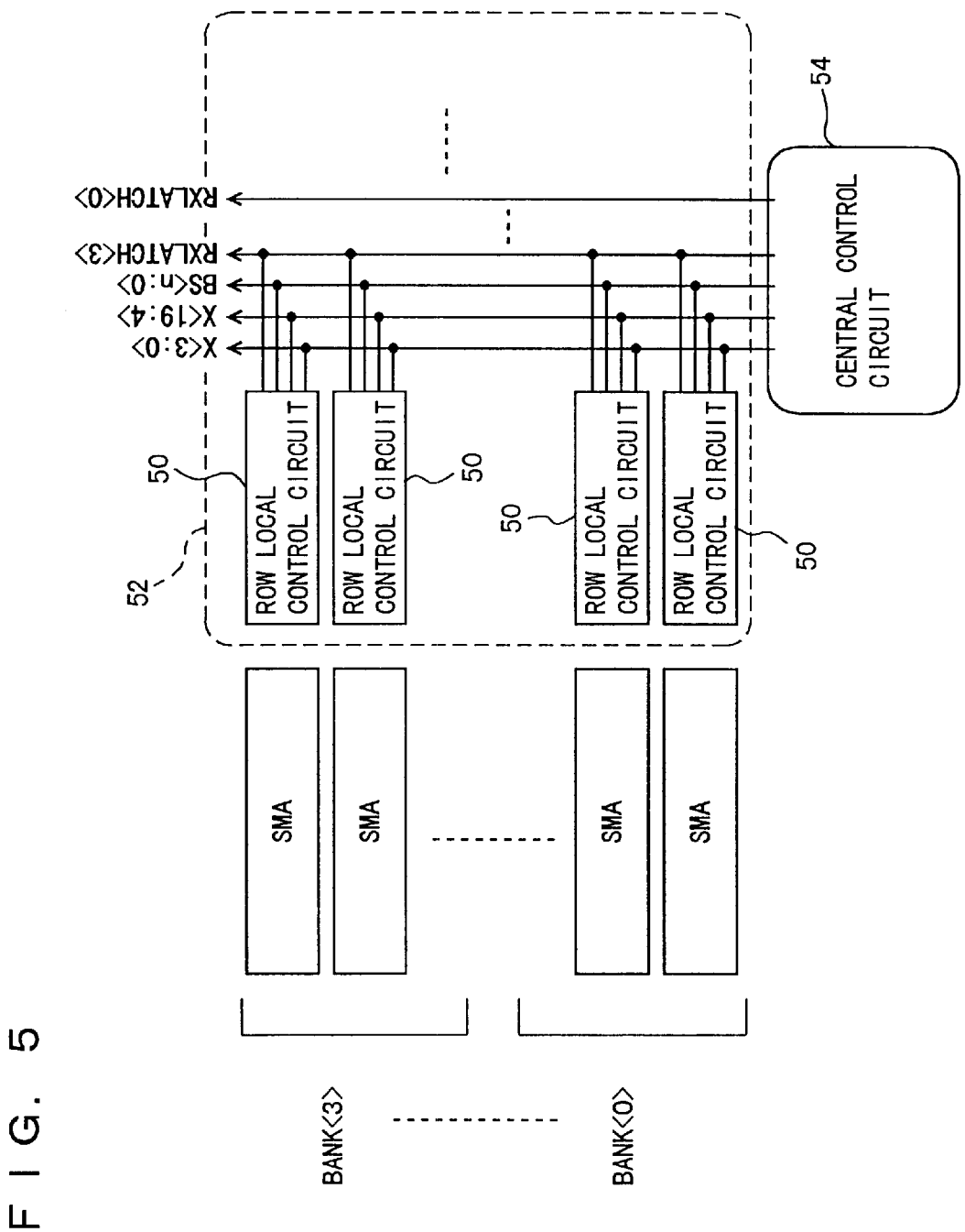
FIG. 5 is a block diagram showing a structure of a row local control circuit of the memory cell array shown in FIG. 4.

Next, the row local control circuit will be detailed with reference to FIGS. 5 to 8. For the simplicity of the description, illustration is made of an example of four bank arrangement in which a plurality of sub-blocks constitute one bank. The following description will be also applied to an n bank arrangement in which one sub-block constitutes one bank. A row local control circuit 50 shown in FIG. 4 is arranged on a backbone band 52 so as to correspond to banks <0> to <3> as illustrated in FIG. 5. In response to predecoded signals X<3:0> and X<19:4>, a block decoded signal BS<n:0> and a row control timing signal RXLATCH <3:0> from a central control circuit 54, each row local control circuit 50 generates a corresponding sub-decoded signal ZSDF <3:0>. The central control circuit 54 includes a circuit for predecoding more significant 9 bits of an address signal. The predecoded signal X<3:0> is a signal obtained by predecoding a row address signal RA<1:0>. The predecoded signal X<19:4> is a signal obtained by predecoding a row address signal RA<9:2>. The block decoded signal BS<n:0> is a signal obtained by a most-significant bit of the row address signal. The row local control timing signal RXLATCH<3:0> is a signal to be activated while a selected bank has its row being activated.

FIG. 6 is a circuit diagram showing a structure of each row local control circuit 50 illustrated in FIG. 5. With reference to FIG. 6, the row local control circuit 50 includes a level latch circuit 56 responsive to a row control timing signal RXLATCH<i> for latching the predecoded signal X<19:4>, a level latch circuit 58 responsive to the row control timing signal RXLATCH<i> for latching a block-decoded signal BS<k> and a level latch circuit 60 responsive to the row control timing signal RXLATCH<i> for latching the predecoded signal X<3:0>. The level latch circuit 56 generates latched predecoded-signals X_Latch<19:12>, X_Latch<11:8> and X_Latch<7:4> for selecting one of 128 main word lines MWL. The level latch circuit 58 generates a latched block-decoded-signal BS_Latch. The level latch circuit 60 generates a latched predecoded-signal X_Latch<3:0>. In response to a word line activation timing control signal RXACTM from the central control circuit 54, an inversion of the latched block-decoded-signal BS_Latch and the latched predecoded-signal X_Latch<3:0>, an AND circuit 62 applies a logical product of these signals to a level shifter 64. The level shifter 64 generates the sub-decoded signal ZSDF<3:0> of a boosted voltage Vpp level higher than a power supply voltage Vcc from the logical product signal of the power supply voltage Vcc.

The row local control circuit 50 further includes a sense amplifier control circuit 66 for generating latched block-decoded-signals BS_Latch_1 and BS_Latch_2 for selectively activating a sense amplifier. The sense amplifier control circuit 66 includes OR circuits 660 and 661, NAND circuits 662 and 663 and inverter circuits 664 and 665. The OR circuit 660 receives latched predecoded-signals X_Latch<0> and X_Latch<1> from the level latch circuit 60. The OR circuit 661 receives latched predecoded-signals X_Latch<3> and X_Latch<4> from the level latch circuit 60. The NAND circuit 662 receives the output signal from the OR circuit 660 and the latched block-decoded-signal BS_Latch from the level latch circuit 58. The NAND circuit 663 receives the output signal of the OR circuit 661 and the latched block-decoded-signal BS_Latch from the level latch circuit 58. The inverter circuit 664 inverts the output signal of the NAND circuit 662 to generate the latched block-decoded-signal BS_Latch_1. The inverter circuit 665 inverts the output signal of the NAND circuit 663 to generate the latched block-decoded-signal BS_Latch_2. Therefore, when the sub-word lines SWL<0> and SWL<1> shown in FIG. 3 are to be selected, the latched predecoded-signals X_Latch<0> and X_Latch<1> are activated and the latched block-decoded-signal BS_Latch_1 is responsively activated. On the other hand, when the sub-word lines SWL<2> and SWL<3> are to be selected, the latched predecoded-signals X_Latch<3> and X_Latch<4> are activated and the latched block-decoded-signal BS_Latch_2 is responsively activated.

Figure 7:
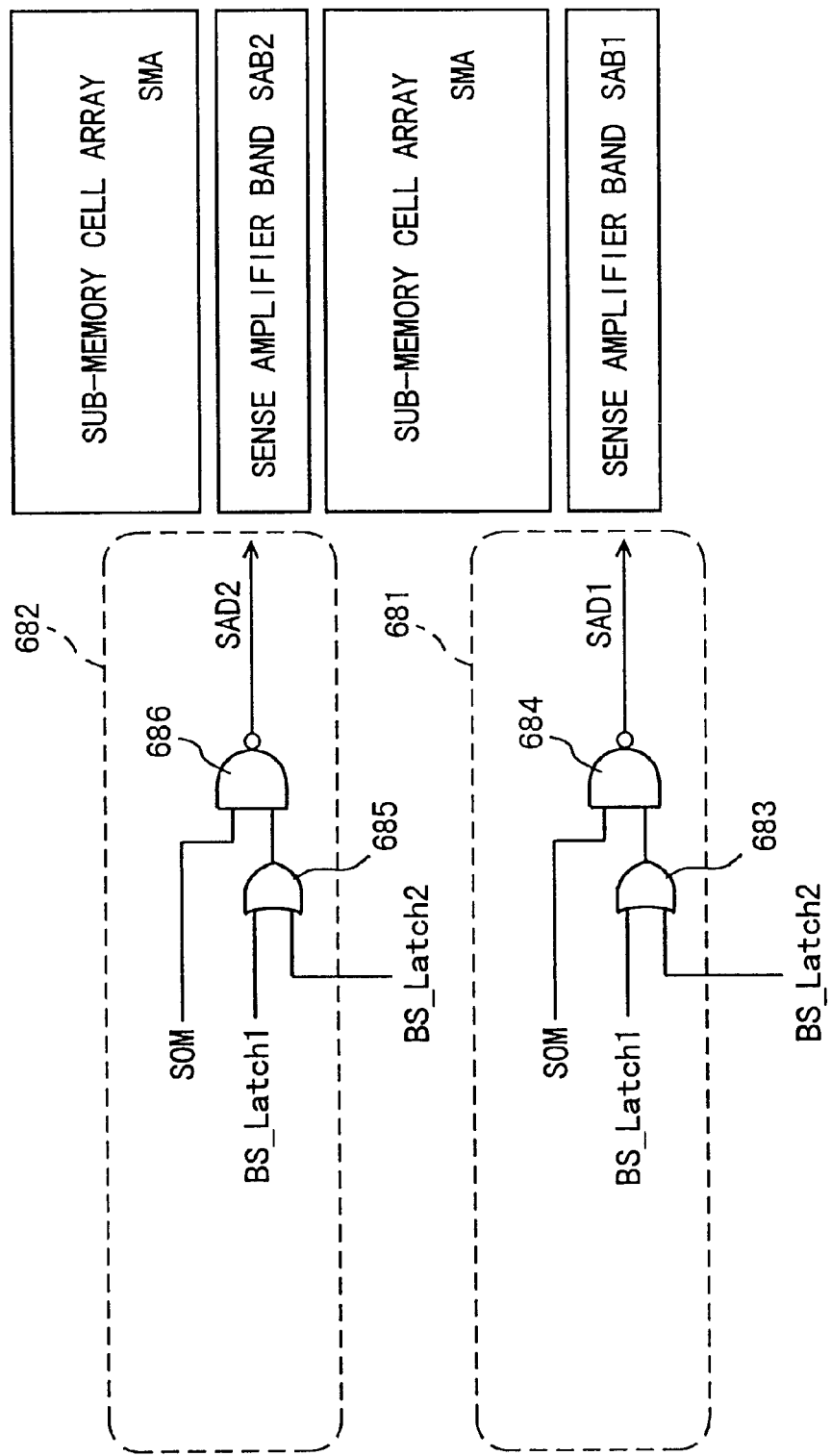
FIG. 7 is a circuit diagram showing a structure of a sense amplifier driving signal generation circuit in the row local control circuit illustrated in FIG. 5.

The row local control circuit 50 further includes such sense amplifier driving signal generation circuits 681 and 682 as illustrated in FIG. 7. The sense amplifier driving signal generation circuit 681 is provided corresponding to the sense amplifier band SAB1 to generate a sense amplifier driving signal SAD1 for activating a plurality of sense amplifiers on the sense amplifier band SAB1. The sense amplifier driving signal generation circuit 682 is provided corresponding to the sense amplifier band SAB2 to generate a sense amplifier driving signal SAD2 for activating a plurality of sense amplifiers on the sense amplifier band SAB2. The sense amplifier driving signal generation circuit 681 includes an OR circuit 683 for receiving the latched block-decoded-signals BS_Latck and BS_Latch_1 and a NAND circuit 684 responsive to the output signal of the OR circuit 683 and a sense amplifier activation timing control signal SOM from the central control circuit 54 for outputting the sense amplifier driving signal SAD1. The sense amplifier driving signal generation circuit 682 includes an OR circuit 685 for receiving the latched block-decoded-signals BS_Latch and BS_Latch_2 and a NAND circuit 686 responsive to the output signal of the OR circuit 685 and the sense amplifier activation timing control signal SOM for outputting the sense amplifier driving signal SAD2. Accordingly, in a case where the sense amplifier activation timing control signal SOM is activated, when the latched block-decoded-signal BS_Latch_1 is activated, the sense amplifier driving signal SAD1 is activated. On the other hand, when the latched block-decoded-signal BS_Latch_2 is activated, the sense amplifier driving signal SAD2 is activated.

Figure 8:
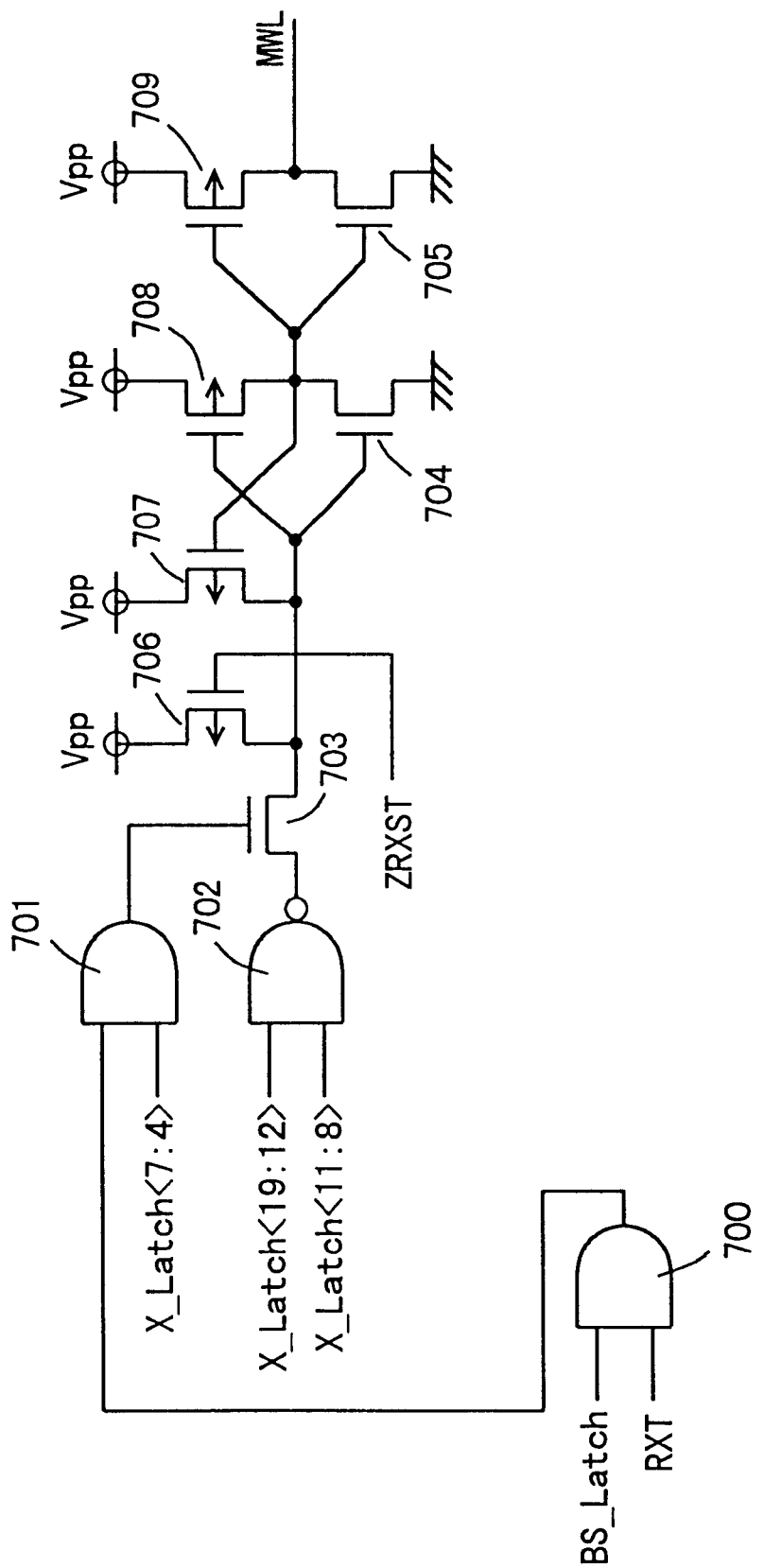
FIG. 8 is a circuit diagram showing a structure of a main word line driving circuit in the row local control circuit illustrated in FIG. 5.

In addition, the row local control circuit further includes such a main word line driving circuit as illustrated in FIG. 8. With reference to FIG. 8, the main word line driving circuit includes AND circuits 700 and 701, a NAND circuit 702, N channel MOS transistors 703 to 705, and P channel MOS transistors 706 to 709. The AND circuit 700 receives a word line activation timing control signal RXT from the central control circuit 54 and the latched block-decoded-signal BS_Latch from the level latch circuit 58. The AND circuit 701 receives the output signal of the AND circuit 700 and the latched predecoded-signal X_Latch<7:4> from the level latch circuit 56. The NAND circuit 702 receives the latched predecoded-signals X_Latch<19:12> and X_Latch<11:8> from the level latch circuit 56. Accordingly, the main word line driving circuit supplies the boosted voltage Vpp to the main word line MWL selected by the latched predecoded-signals X_Latch<19:12>, X_Latch<11:8> and X_Latch<7:4>.

Thus, since the first embodiment adopts the simple stack-type memory cell 12 requiring a reduced number of process steps, no large step will be generated on the boundaries between a DRAM core and a large-scale logic, whereby a system LSI with DRAMs of a large capacity mounted together with logics can be realized which is hard to be realized by an SRAM. In addition, since the storage node 22 is formed over two bit lines BL and ZBL, the capacitor 12 can be formed to have a large capacity. Furthermore, since between two bit line pairs whose voltages swing, a bit line pair whose voltage is fixed is arranged, even a CUB structure in which the capacitor 12 is formed under the bit line BL achieves as high a noise-tolerance as that obtained by the COB structure. Moreover, since in a multi-bank structure having the shared sense amplifier arrangement, two sense amplifier bands arranged on the opposite sides of a sub-memory cell array are selectively activated, a system LSI with DRAM mounted together with logic having a multi-bank structure can be realized whose probability of contention of bank accesses is suppressed.

[Second Embodiment]

Figure 9:
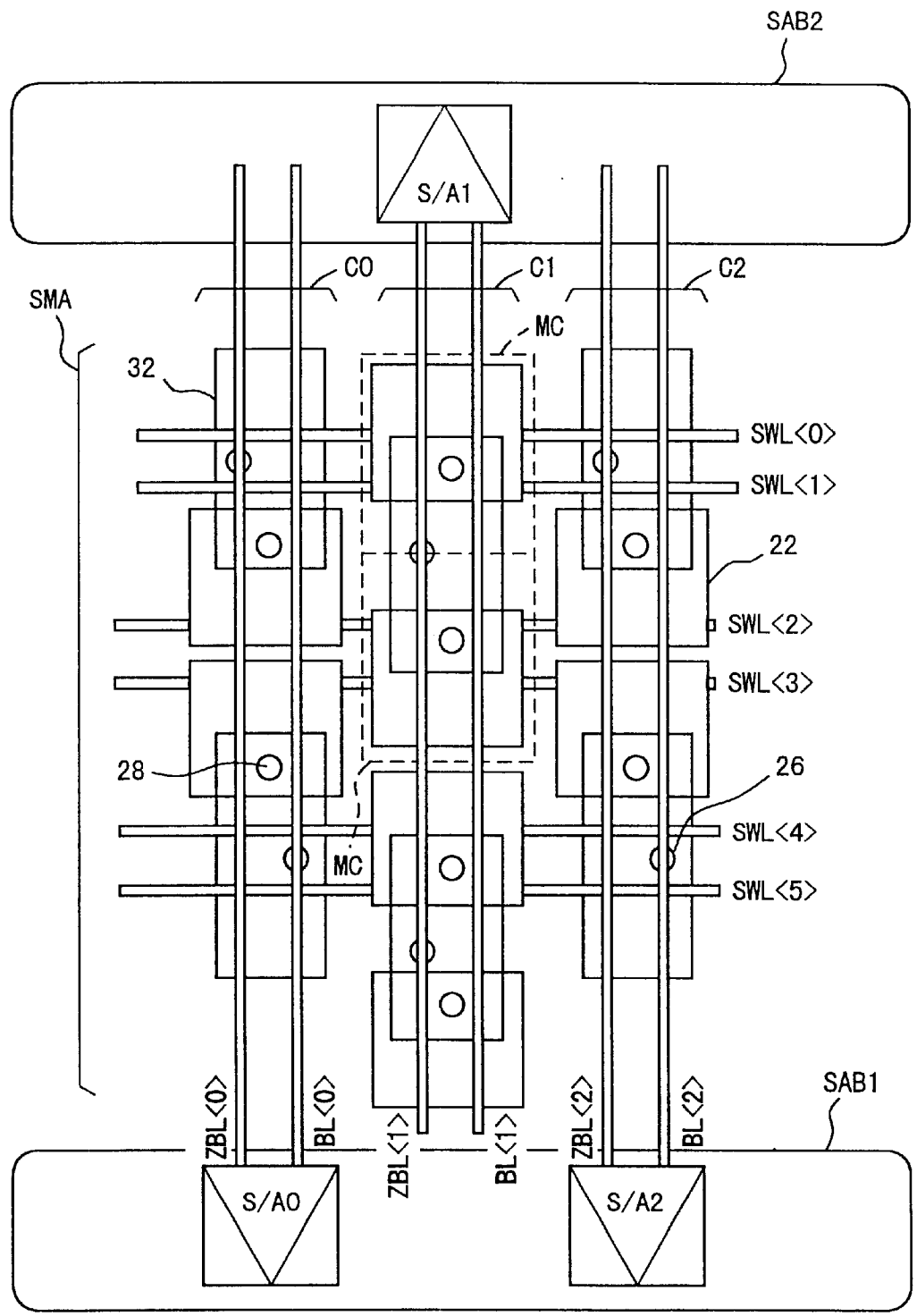
FIG. 9 is a layout diagram showing a structure of a sub-memory cell array and sense amplifier bands on the opposite sides thereof in a system LSI according to a second embodiment of the present invention.

FIG. 9 is a layout diagram schematically showing a structure of a sub-memory cell array in a system LSI according to a second embodiment of the present invention. The arrangement shown in FIG. 9 is a closest packing cell arrangement in which bit line contacts 26 and storage node contacts 28 are arranged in lattice. Illustrated here is a "⅓ pitch cell" arrangement in which projection of a minimum pitch length of a memory cell obtained by obliquely linking the bit line contacts 26 in the bit line direction has a length one-third a memory cell MC arrangement pitch in the bit line direction. While a conventional DRAM cell arrangement only allows an open bit line structure having a low noise-tolerance, such a bit line arrangement as mentioned above realizes a folded bit line structure having a high noise-tolerance. The remaining part of the structure is the same as that of the first embodiment.

[Third Embodiment]

Figure 10:
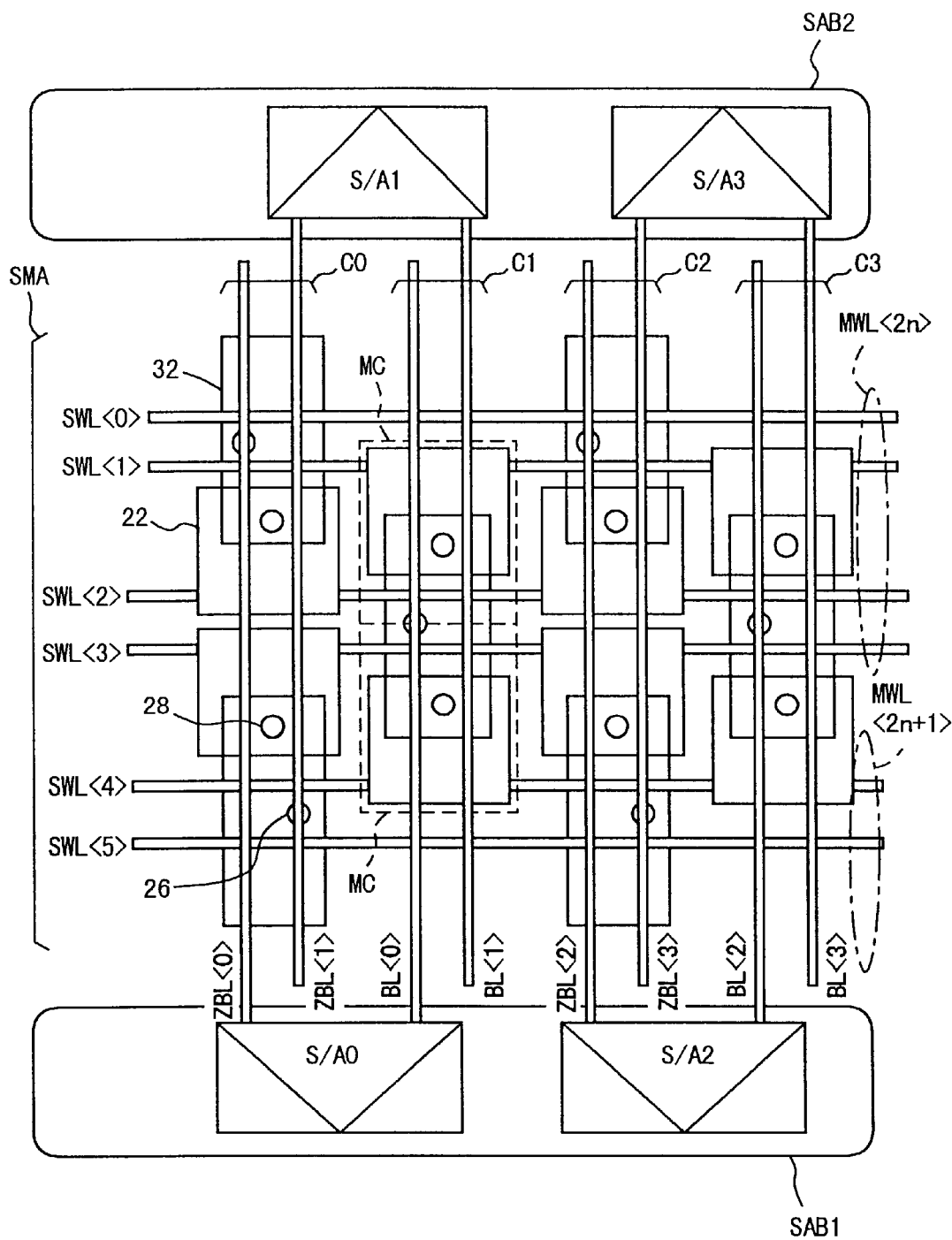
FIG. 10 is a layout diagram showing a structure of a sub-memory cell array and sense amplifier bands on the opposite sides thereof in a system LSI according to a third embodiment of the present invention.

FIG. 10 is a layout diagram showing a schematic structure of a sub-memory cell array in a system LSI according to a third embodiment of the present invention. The third embodiment also adopts a "half-pitch cell" arrangement similarly to the above-described first embodiment. Also similarly to the above-described first and second embodiments, a bit line arrangement pitch is half a memory cell MC arrangement pitch in the word line direction. More specifically, two bit lines BL and ZBL are arranged in each of columns C0 to C2 in which a plurality of memory cells MC are arranged approximately on a straight line.

Unlike the above-described first and second embodiments, every other bit line, two bit lines BL and ZBL are in pairs connected to a sense amplifier S/A.

In this structure, when sub-word lines SWL<0> to SWL<3> connected to one MWL<2n> of even-numbered main word lines are selected, data of memory cells MC connected to the selected sub-word lines SWL<0> to SWL<3> is read onto bit lines BL<0>, ZBL<0>, BL<2> and ZBL<2> and amplified by sense amplifiers S/A0 and S/A2 on a sense amplifier band SAB1 through a bit line isolation gate (not shown). On the other hand, when sub-word lines SWL<4> to SWL<7> (SWL<6> and SWL<7> are not shown in FIG. 10) connected to one MWL<2n+1> of odd-numbered main word lines are selected, data of memory cells MC connected to the selected sub-word lines SWL<4> to SWL<7> is read onto bit lines BL<1>, ZBL<1>, BL<3> and ZBL<3> and amplified by sense amplifiers S/A1 and S/A3 on a sense amplifier band SAB2 through a bit line isolation gate (not shown).

Figure 11:
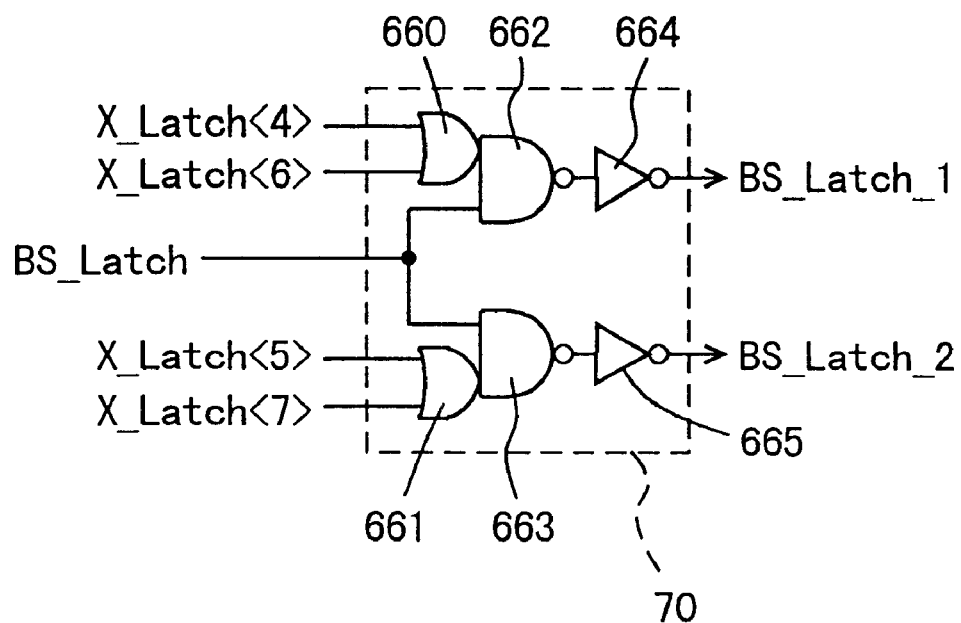
FIG. 11 is a circuit diagram showing a structure of a control circuit for selecting the sense amplifier band illustrated in FIG. 10.

Whether a main word line MW to be selected is even-numbered or odd-numbered is determined by a third less-significant bit RA<2> of a row address signal. In this case, a row local control circuit provides control such that in a sub-block selected by a block decoded signal, whether the sense amplifier band SAB1 or SAB2 is to be activated is selected based on the third less-significant bit of the row address signal. In this case, a row local control circuit 50 includes such a sense amplifier control circuit 70 as illustrated in FIG. 11. Although the sense amplifier control circuit 70 is basically the same as the sense amplifier selection circuit 66 shown in FIG. 6, in the present embodiment, an OR circuit 660 receives latched predecoded-signals X_Latch<4> and X_Latch<6> and an OR circuit 661 receives latched predecoded-signals X_Latch<5> and X_Latch<7>. Accordingly, when the sub-word lines SWL<0> to SWL<3> in FIG. 10 are to be selected, the latched predecoded-signal X_Latch<4> or X_Latch<6> is activated to active a latched block-decoded-signal BS_Latch_1 for selecting the sense amplifier band SAB1. On the other hand, when the sub-word lines SWL<4> to SWL<7> in FIG. 10 are to be selected, the latched predecoded-signal X_Latch<5> or X_Latch<7> is activated to active a latched block-decoded-signal BS_Latch_2 for selecting the sense amplifier band SAB2.

Thus, according to the third embodiment, since between bit line pairs whose voltages swing, a bit line whose voltage will not change is arranged, bit lines are shielded from each other. As a result, even the CUB structure obtains as high a noise-tolerance as that of the COB structure and moreover, noise between bit line pairs can be better shielded than in the above-described first and second embodiments.

[Fourth Embodiment]

Figure 12:
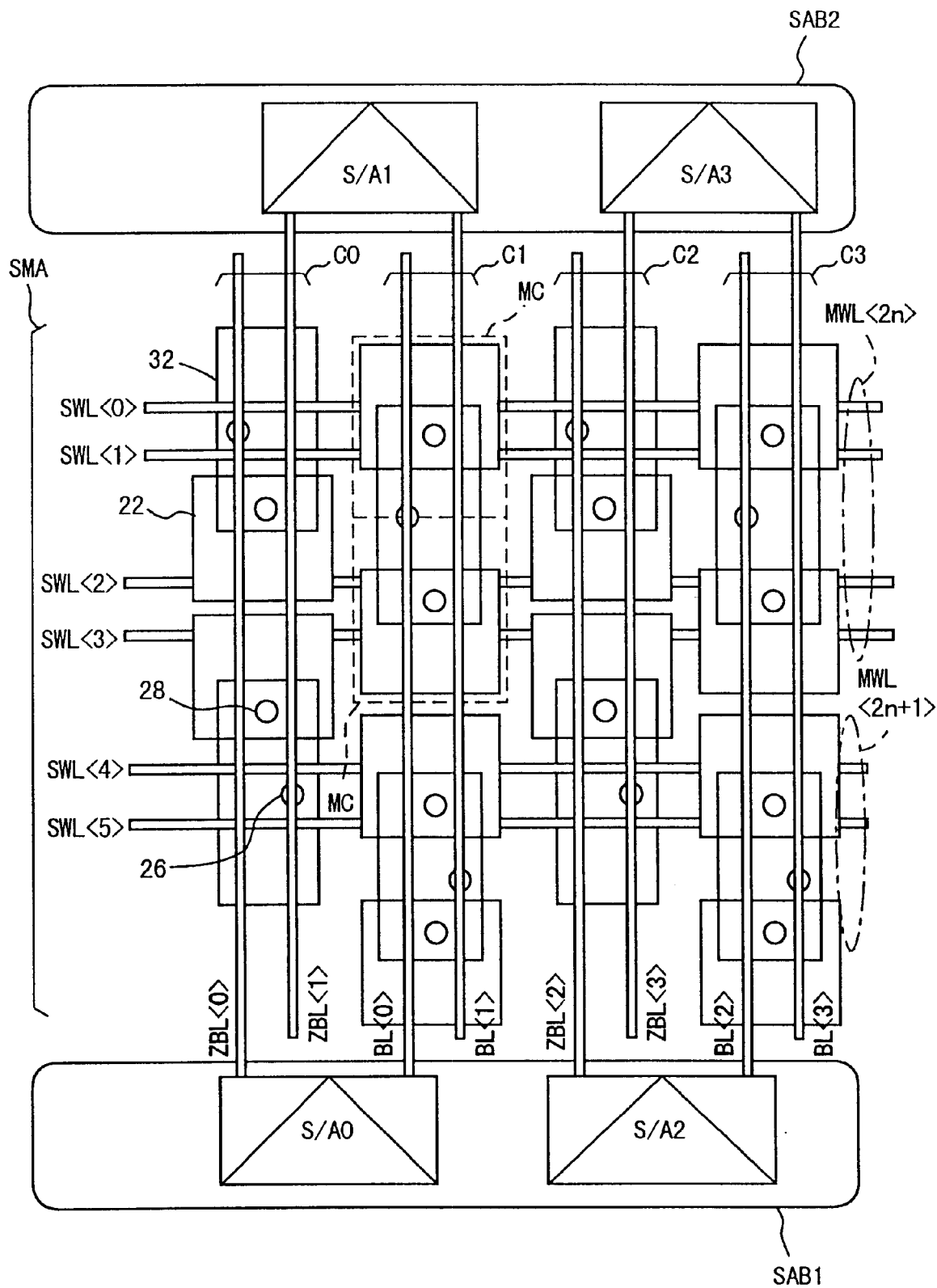
FIG. 12 a layout diagram showing a structure of a sub-memory cell array and sense amplifier bands on the opposite sides thereof in a system LSI according to a fourth embodiment of the present invention.

FIG. 12 is a layout diagram showing a schematic structure of a sub-memory cell array in a system LSI according to a fourth embodiment of the present invention. The fourth embodiment is almost the same as the above-described third embodiment, with the only difference in having a "⅓ pitch cell" arrangement from the above-described third embodiment having a "half pitch cell" arrangement.

[Fifth Embodiment]

Figure 13:
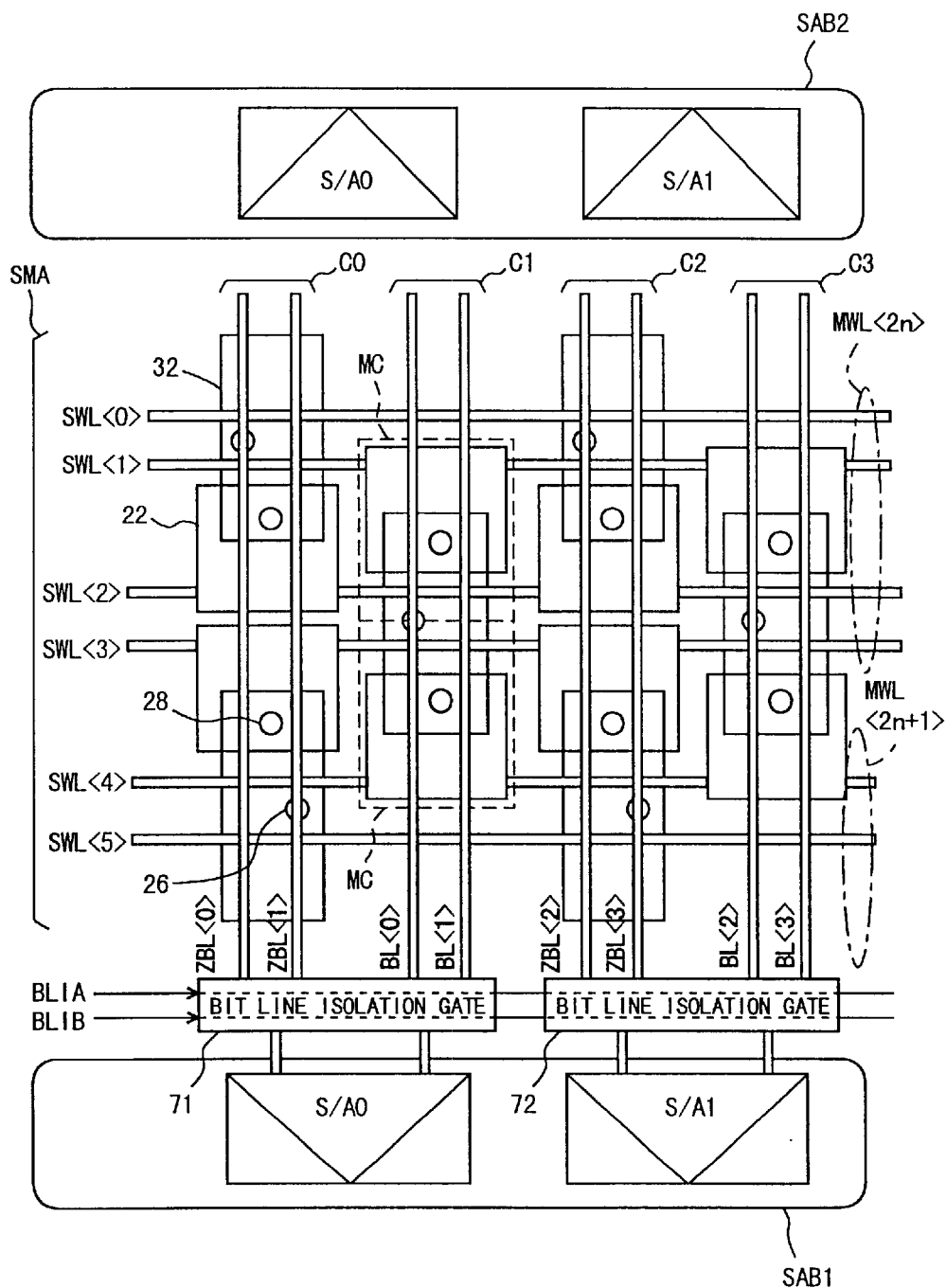
FIG. 13 a layout diagram showing a structure of a sub-memory cell array and sense amplifier bands on the opposite sides thereof in a system LSI according to a fifth embodiment of the present invention.

FIG. 13 is a layout diagram showing a schematic structure of a sub-memory cell array in a system LSI according to a fifth embodiment of the present invention. Unlike the third embodiment shown in FIG. 10, in the fifth embodiment, bit line isolation gates 71 and 72 are provided for selecting one of two bit line pairs and connecting the same to a sense amplifier. The bit line isolation gate 71 selects the bit line pair BL<1>, ZBL<1> when a bit line isolation signal BLIA is activated and selects the bit line pair BL<0>, ZBL<0> when a bit line isolation signal BLIB is activated and connects the selected bit line pair to the sense amplifier S/A0 on the sense amplifier band SAB1. The bit line isolation gate 72 selects bit line pair BL<3>, ZBL<3> when the bit line isolation signal BLIA is activated and selects the bit line pair BL<2>, ZBL<2> when the bit line isolation signal BLIB is activated and connects the selected bit line pair to the sense amplifier S/A1 on the sense amplifier band SAB1. Unlike the above-described first to fourth embodiments, in the fifth embodiment, the bit line pairs BL<0>, ZBL<0> to BL<3>, ZBL<3> are not connected to the sense amplifiers S/A0 and S/A1 on the sense amplifier band SAB2. In other words, the sense amplifier bands SAB1 and SAB2 are not shared by two adjacent sub-memory cell arrays and each band is in charge of amplification of data from one corresponding sub-memory cell array.

Figure 14:
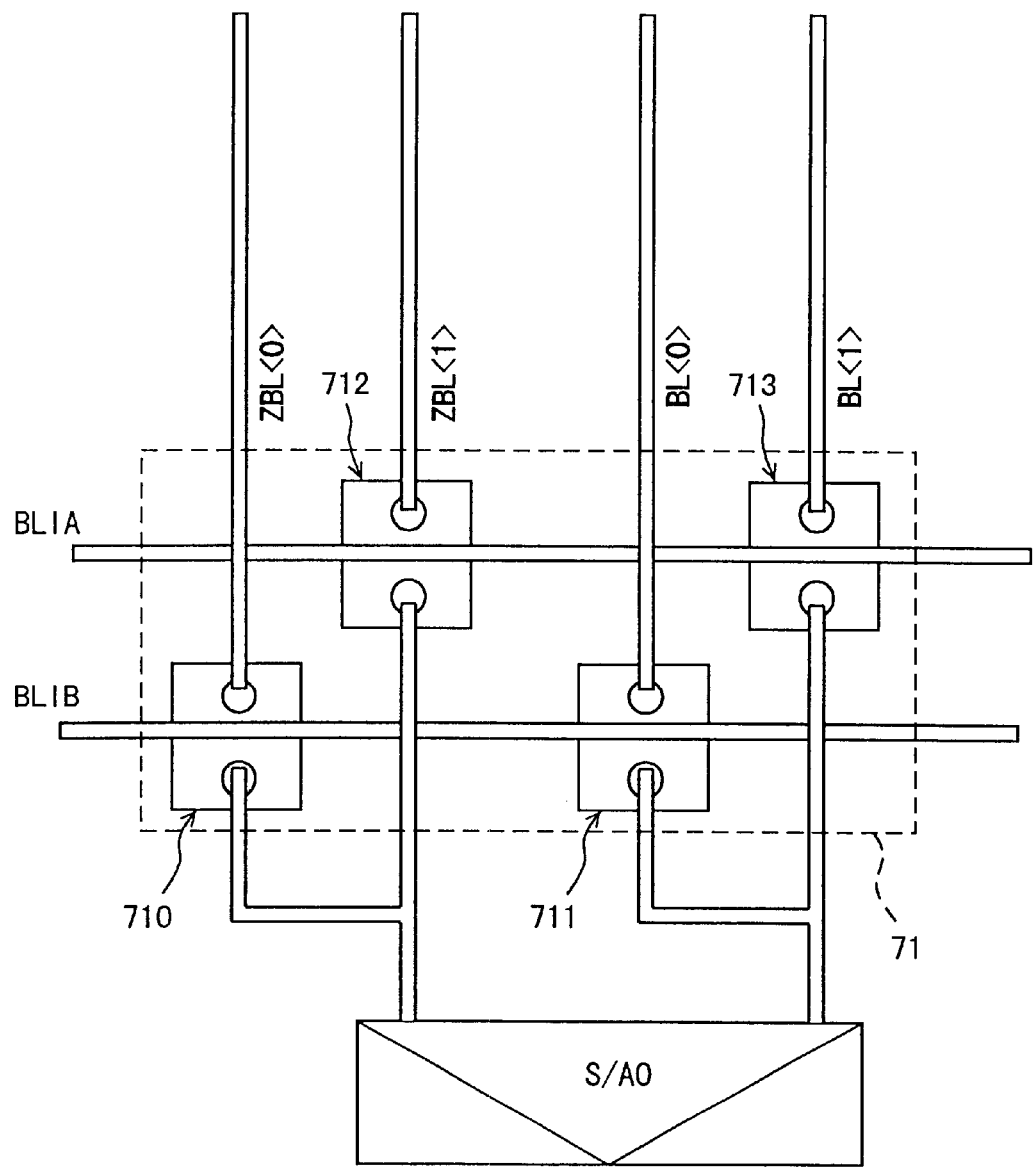
FIG. 14 is a layout diagram showing a structure of a bit line isolation gate illustrated in FIG. 13.

FIG. 14 is a layout diagram showing a structure of the bit line isolation gate 71. With reference to FIG. 14, the bit line isolation gate 71 includes MOS transistors 710 to 713 formed on a semiconductor substrate. A signal line for the bit line isolation signal BLIA forms gate electrodes of the transistors 712 and 713. A signal line for the bit line isolation signal BLIB forms gate electrodes of the transistors 710 and 711.

Figure 15:
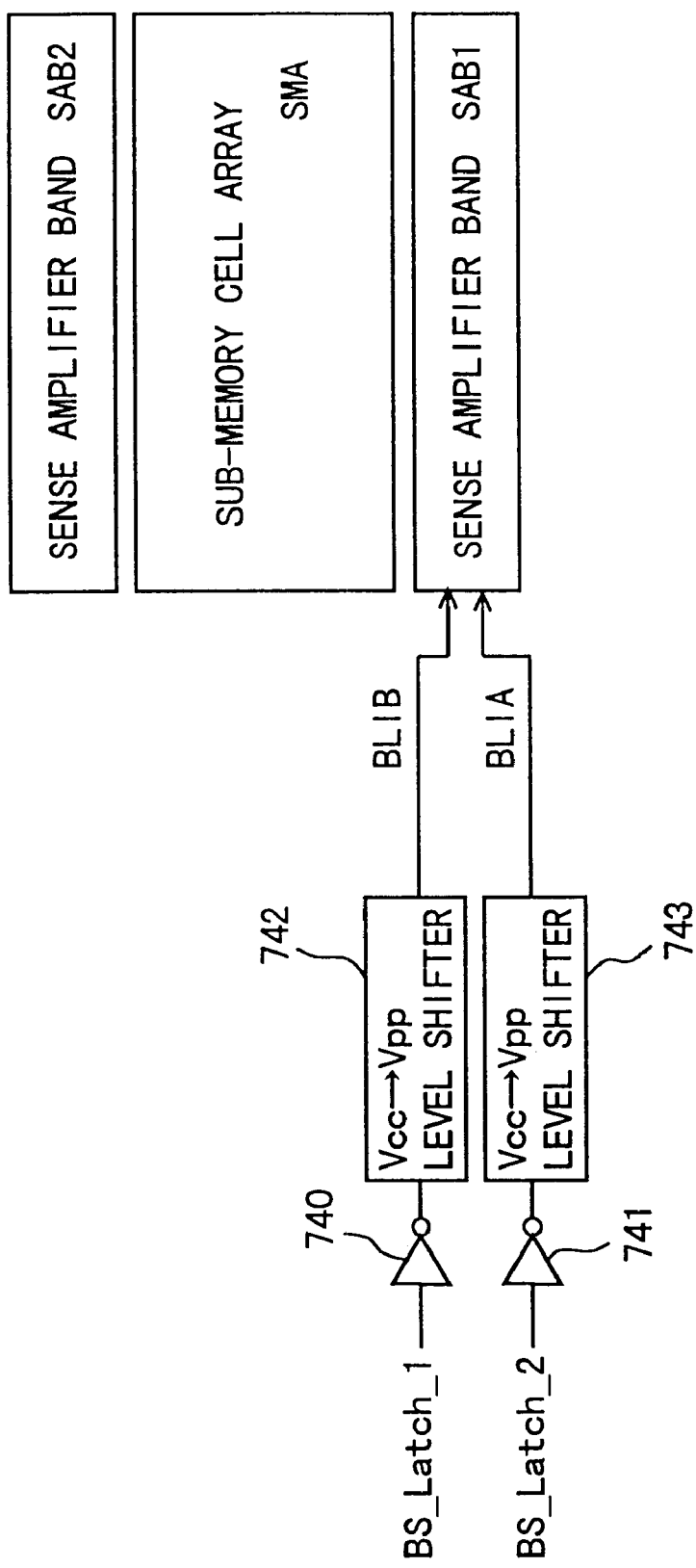
FIG. 15 is a block diagram showing a structure of a control circuit for controlling the bit line isolation gate illustrated in FIG. 13.

In this case, the row local control circuit 50, as illustrated in FIG. 15, includes inverter circuits 740 and 741 and level shifters 742 and 743. The inverter 740 inverts the latched block-decoded-signal BS_Latch_1 from the control circuit 70 shown in FIG. 11 and applies the inverted signal to the level shifter 742. The inverter circuit 741 inverts the latched block-decoded-signal BS_Latch_2 from the control circuit 70 and applies the inverted signal to the level shifter 743. The level shifter 742 converts the inverted signal of the latched block-decoded-signal BS_Latch_1 of a power supply voltage Vcc level into the bit line isolation signal BLIB of a boosted voltage Vpp level. The level shifter 743 converts the inverted signal of the latched block-decoded-signal BS_Latch_2 into the bit line isolation signal BLIA of the boosted voltage Vpp level. The bit line isolation signals BLIA and BLSIB are at a "H" (logical high) level during a standby period. When a sub-block is selected by a block-decoded signal BS to activate the latched block-decoded-signal BS_Latch_1, the bit line isolation signal BLIS attains a "L" (logical low) level and when the latched block-decoded-signal BS_Latch_2 is activated, the bit line isolation signal BLIA attains the "L" level. When the bit line isolation signal BLIA attains the "L" level, the bit line pairs BL<1>, ZBL<1> and BL<3>, ZBL<3> are cut off from the sense amplifiers S/A0 and S/A1, respectively. On the other hand, when the bit line isolation signal BLIB attains the "L" level, the bit line pairs BL<0>, ZBL<0> and BL<2>, ZBL<2> are cut off from the sense amplifiers S/A0 and S/A1, respectively.

In this structure, for selecting the even-numbered main word line <2n> connected to the sub-word lines SWL<0> to SWL<3>, the bit line isolation gates 71 and 72 connect the bit line pairs BL<0>, ZBL<0> and BL<2>, ZBL<2> to the sense amplifiers S/A0 and S/A1, respectively, and cut off the bit line pairs BL<1>, ZBL<1> and BL<3>, ZBL<3> from the sense amplifiers S/A0 and S/A1, respectively. On the other hand, for selecting the odd-numbered main word line MWL<2n+1> connected to the sub-word lines SWL<4> to SWL<7>, the bit line isolation gates 71 and 72 connect the bit line pairs BL<1>, ZBL<1> and BL<3>, ZBL<3> to the sense amplifiers S/A0 and S/A1, respectively, and cut off the bit line pairs BL<0>, ZBL<0> and BL<2>, ZBL<2> from the sense amplifiers S/A0 and S/A1, respectively.

As described in the foregoing, according to the fifth embodiment, since each sense amplifier band is not shared by two adjacent sub-memory cell arrays, a probability of contention of bank accesses will be 1/n, resulting in avoiding reduction in random access performance.

The bit line isolation gate in the fifth embodiment can be provided also in the above-described first and second embodiments. In such a case, control may be provided such that the bit line isolation signal BLIA or BLIB is activated according to whether the sub-decoding signals ZSDF<0> and ZSDF<1> are selected or the sub-decoding signals ZSDF<2>0 and ZSDF<3> are selected.

[Sixth Embodiment]

Figure 16:
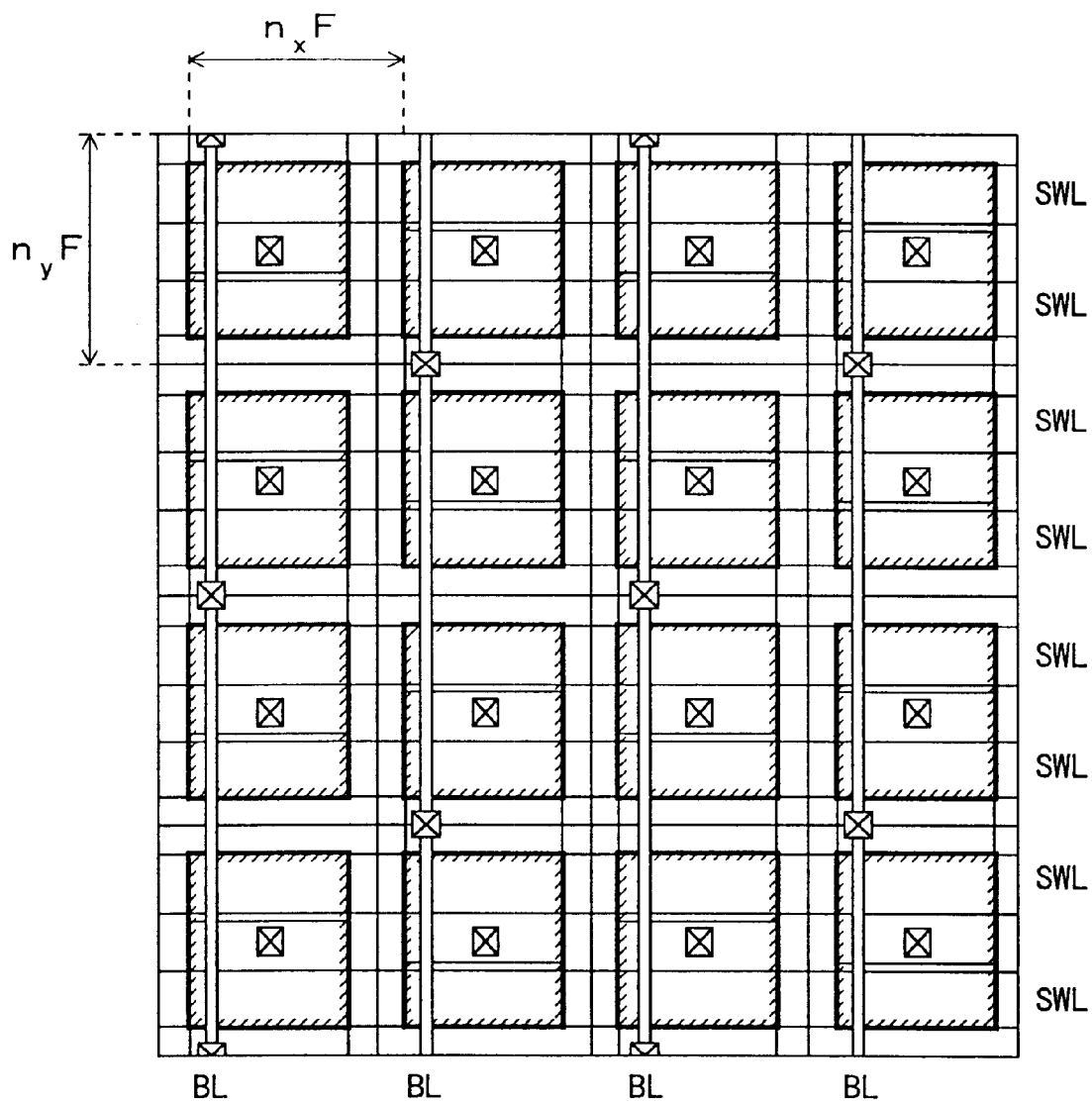
FIG. 16 is a layout diagram showing a structure of a sub-memory cell array in a system LSI according to a sixth embodiment of the present invention.
Figure 17:
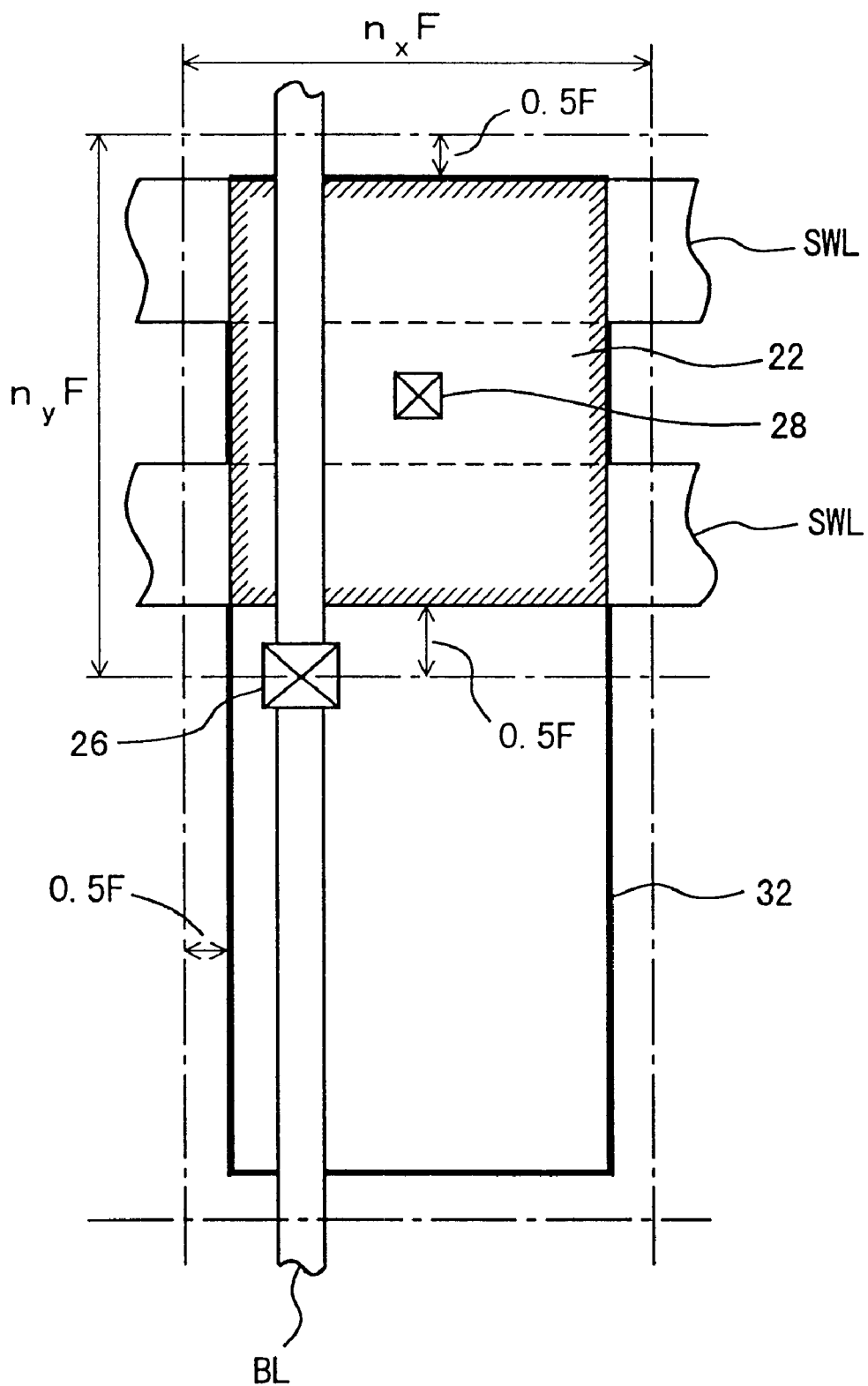
FIG. 17 is a layout diagram showing expansion of two of the memory cells illustrated in FIG. 16.

FIG. 16 is a layout diagram of a memory cell array according to a sixth embodiment of the present invention. In FIG. 16, 16 (=4×4) memory cells are illustrated. FIG. 17 is a layout diagram showing expansion of two of the memory cells illustrated in FIG. 16.

In a conventional DRMA, an aspect ratio of a memory cell is approximately 1:2 and an $8F^2$ (=2F×4F) cell having a lateral size of 2F and a vertical size of 4F is adopted. Here, F denotes a value called "minimum process size" (Feature Size) which is obtained by adding a margin (overlapping in lithographic process etc.) to a design criterion (=minimum size).

In the sixth embodiment, memory size is optimized as follows.

In FIG. 16, assume that a size in the word line direction (horizontal direction in FIG. 16) is denoted as $n_x F$ and a cell size in the bit line direction (vertical direction in FIG. 16) is denoted as $n_y F$. Here, $n_x$ is an integer not less than 2 and $n_y$ is an integer not less than 4. In this case, an area $S_{cap}$ of a planer type capacitor in the memory cell is given by the following equation (1).

$$S_{cap} = (n_x F - F) \times (n_y F - F) \quad (1)$$

On the other hand, a memory cell area $S_{cell}$ is given by the following expression (2).

$$S_{cell} = n_x F \times n_y F \quad (2)$$

Shown in Tables 1, 2 and 3 are results of requirements for ensuring a capacitor capacity necessary for a memory cell of a DRAM, for example, for ensuring 25 fF, which are obtained when a capacitor insulation film is, for example, F=0.18 μm in the cases of tox=5 nm, 3.5 nm and 2 nm in terms of an oxide film, respectively. It can be seen from Table 1 that when tox=5 nm, a minimum cell area is realized by 6.3 μm² (lateral size=14 F, vertical size=14 F), from Table 2 that when tox=3.5 nm, a minimum cell area is realized by 3.13 μm² (lateral size=10 F, vertical size=10 F) and from Table 3 that when tox=2 nm, a minimum cell area is realized by 1.56 μm² (laterial size=7F, vertical size=7 F).

TABLE 1

| tox (nm) | capacitor area | F (μm) | $N_x \geq 2$ | $N_y \geq 4$ | cell size ($F^2$) | cell area (μm²) |
|---|---|---|---|---|---|---|
| 5.00 | 5.43 | 0.18 | 4.00 | 56.86 | 227.46 | 7.3696 |
| 5.00 | 5.43 | 0.18 | 5.00 | 42.90 | 214.49 | 6.9495 |
| 5.00 | 5.43 | 0.18 | 6.00 | 34.52 | 207.11 | 6.7104 |
| 5.00 | 5.43 | 0.18 | 11.00 | 17.76 | 195.35 | 6.3294 |
| 5.00 | 5.43 | 0.18 | 12.00 | 16.24 | 194.83 | 6.3124 |
| 5.00 | 5.43 | 0.18 | 13.00 | 14.97 | 194.56 | 6.3037 |
| *5.00 | 5.43 | 0.18 | 14.00 | 13.89 | 194.48 | 6.3013 |
| 5.00 | 5.43 | 0.18 | 15.00 | 12.97 | 194.56 | 6.3039 |
| 5.00 | 5.43 | 0.18 | 16.00 | 12.17 | 194.77 | 6.3104 |
| 5.00 | 5.43 | 0.18 | 17.00 | 11.47 | 195.07 | 6.3202 |
| 5.00 | 5.43 | 0.18 | 18.00 | 10.86 | 195.45 | 6.3326 |

TABLE 1-continued

| tox (nm) | capacitor area | F (μm) | $N_x \geq 2$ | $N_y \geq 4$ | cell size ($F^2$) | cell area ($\mu m^2$) |
|---|---|---|---|---|---|---|
| 5.00 | 5.43 | 0.18 | 20.00 | 9.82 | 196.41 | 6.3638 |
| 5.00 | 5.43 | 0.18 | 30.00 | 6.78 | 203.37 | 6.5892 |
| 5.00 | 5.43 | 0.18 | 100.00 | 2.69 | 269.29 | 8.7248 |

TABLE 2

| tox (nm) | capacitor area | F (μm) | $N_x \geq 2$ | $N_y \geq 4$ | cell size ($F^2$) | cell area ($\mu m^2$) |
|---|---|---|---|---|---|---|
| 3.50 | 2.53 | 0.18 | 4.00 | 27.03 | 108.12 | 3.5029 |
| 3.50 | 2.53 | 0.18 | 5.00 | 20.52 | 102.61 | 3.3245 |
| 3.50 | 2.53 | 0.18 | 6.00 | 16.62 | 99.70 | 3.2304 |
| 3.50 | 2.53 | 0.18 | 7.00 | 14.01 | 98.10 | 3.1785 |
| 3.50 | 2.53 | 0.18 | 8.00 | 12.16 | 97.24 | 3.1506 |
| 3.50 | 2.53 | 0.18 | 9.00 | 10.76 | 96.85 | 3.1379 |
| *3.50 | 2.53 | 0.18 | 10.00 | 9.68 | 96.76 | 3.1351 |
| 3.50 | 2.53 | 0.18 | 11.00 | 8.81 | 96.90 | 3.1394 |
| 3.50 | 2.53 | 0.18 | 12.00 | 8.10 | 97.19 | 3.1488 |
| 3.50 | 2.53 | 0.18 | 13.00 | 7.51 | 97.59 | 3.1620 |
| 3.50 | 2.53 | 0.18 | 14.00 | 7.01 | 98.09 | 3.1782 |
| 3.50 | 2.53 | 0.18 | 20.00 | 5.11 | 102.20 | 3.3112 |
| 3.50 | 2.53 | 0.18 | 22.00 | 4.72 | 103.80 | 3.3633 |
| 3.50 | 2.53 | 0.18 | 27.00 | 4.00 | 108.09 | 3.5021 |

TABLE 3

| tox (nm) | capacitor area | F (μm) | $N_x \geq 2$ | $N_y \geq 4$ | cell size ($F^2$) | cell area ($\mu m^2$) |
|---|---|---|---|---|---|---|
| 2.00 | 1.15 | 0.18 | 4.00 | 12.83 | 51.33 | 1.6629 |
| 2.00 | 1.15 | 0.18 | 5.00 | 9.87 | 49.37 | 1.5995 |
| 2.00 | 1.15 | 0.18 | 6.00 | 8.10 | 48.59 | 1.5744 |
| *2.00 | 1.15 | 0.18 | 7.00 | 6.92 | 48.41 | 1.5685 |
| 2.00 | 1.15 | 0.18 | 8.00 | 6.07 | 48.56 | 1.5735 |
| 2.00 | 1.15 | 0.18 | 9.00 | 5.44 | 48.93 | 1.5854 |
| 2.00 | 1.15 | 0.18 | 10.00 | 4.94 | 49.44 | 1.6018 |
| 2.00 | 1.15 | 0.18 | 11.00 | 4.55 | 50.04 | 1.6214 |
| 2.00 | 1.15 | 0.18 | 12.00 | 4.23 | 50.72 | 1.6433 |
| 2.00 | 1.15 | 0.18 | 13.00 | 3.96 | 51.45 | 1.6670 |
| 2.00 | 1.15 | 0.18 | 14.00 | 3.73 | 52.22 | 1.6921 |
| 2.00 | 1.15 | 0.18 | 20.00 | 2.87 | 57.36 | 1.8585 |
| 2.00 | 1.15 | 0.18 | 22.00 | 2.69 | 59.18 | 1.9176 |
| 2.00 | 1.15 | 0.18 | 27.00 | 2.37 | 63.86 | 2.0690 |

[Seventh Embodiment]

Figure 22:
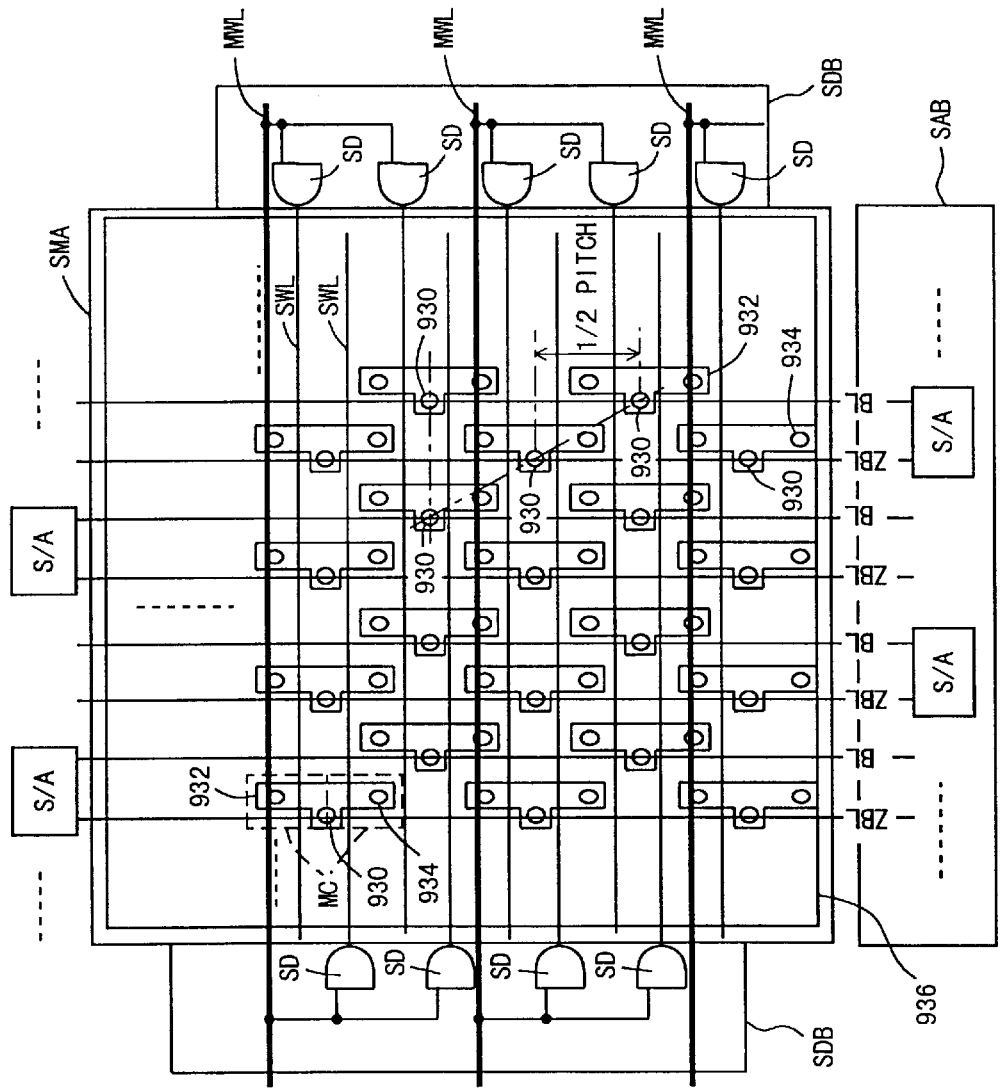
FIG. 22 is a layout diagram showing a structure of a sub-memory cell array, sub-word driver bands on the opposite site sides thereof and sense amplifier bands on the opposite sides thereof in the DRAM core illustrated in FIG. 20.

As illustrated in FIG. 22, in a conventional DRAM, since a sub-word line SWL arrangement pitch is as tight as a minimum fine fabrication process size F, layout is eased by arranging sub-word drivers SD alternately on sub-word driver bands SDB on the opposite sides. In other words, one sub-word decoder SD is arranged per two sub-word lines SWL. The sub-word driver on each sub-word decoder band SDB drives even-numbered or odd-numbered sub-word line SWL.

According to the above-described fifth embodiment, in a case where a capacitor insulation film has tox=2 nm in terms of an oxide film, an optimum memory size in the bit direction will be 7 F, which is 1.75 times the conventional memory size 4 F. A sub-word line arrangement pitch will be eased accordingly. As a result, arrangement of all the sub-word drivers for driving even-numbered and odd-numbered sub-word lines SWL on one sub-word driver band is possible.

Figure 18:
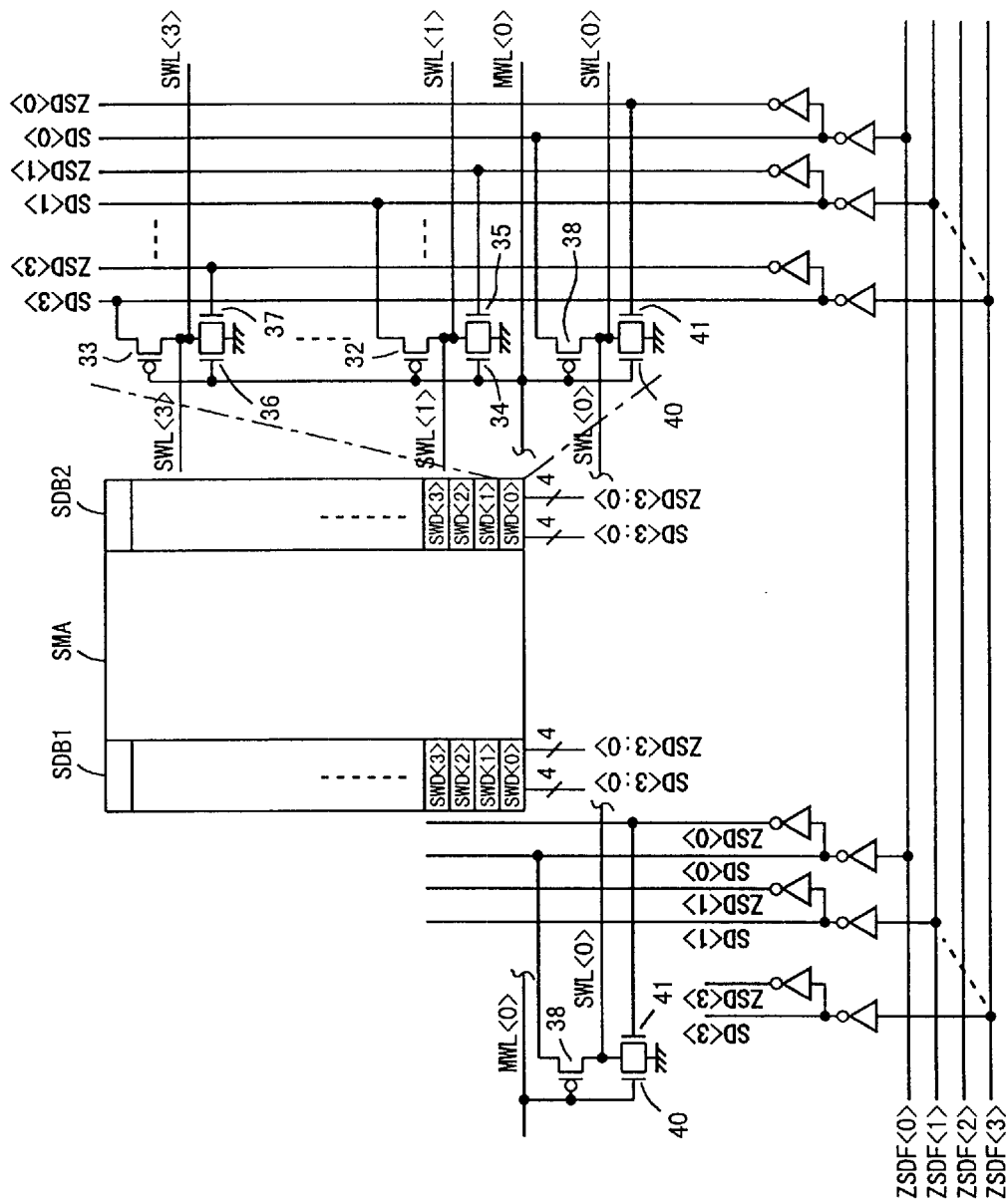
FIG. 18 a circuit diagram showing a structure of a sub-memory cell array and sub-word driver bands on the opposite sides thereof in a system LSI according to a seventh embodiment of the present invention.

FIG. 18 is a circuit diagram showing a schematic structure of a sub-memory cell array and a sub-word driver band in a system LSI according to a seventh embodiment of the present invention. Unlike the structure shown in FIG. 3, all the sub-word drivers SWD<0> to SWD<3> are disposed on each of the sub-word driver bands SDB1 and SDB2 in the present seventh embodiment. The structures of the sub-word driver bands SDB1 and SDB2 are therefore the same. For example, the sub-word driver SWD<0> on the sub-word driver band SDB1 drives four sub-word lines SWL<0> to SWL<3> on the sub-memory cell array SMA, while the sub-word driver SWD<0> on the sub-word driver band SDB2 also drives the four sub-word lines SWL<0> to SWL<3> on the same sub-memory cell array SMA.

Thus, according to the present embodiment, since two sub-word drivers SWD opposed to each other drive one sub-word line SWL from the opposite sides, even if a memory cell arrangement pitch in the word line direction is increased to longer the sub-word line by the increase, delay in rise and fall of the sub-word line SWL can be suppressed.

[Eighth Embodiment]

Figure 19:
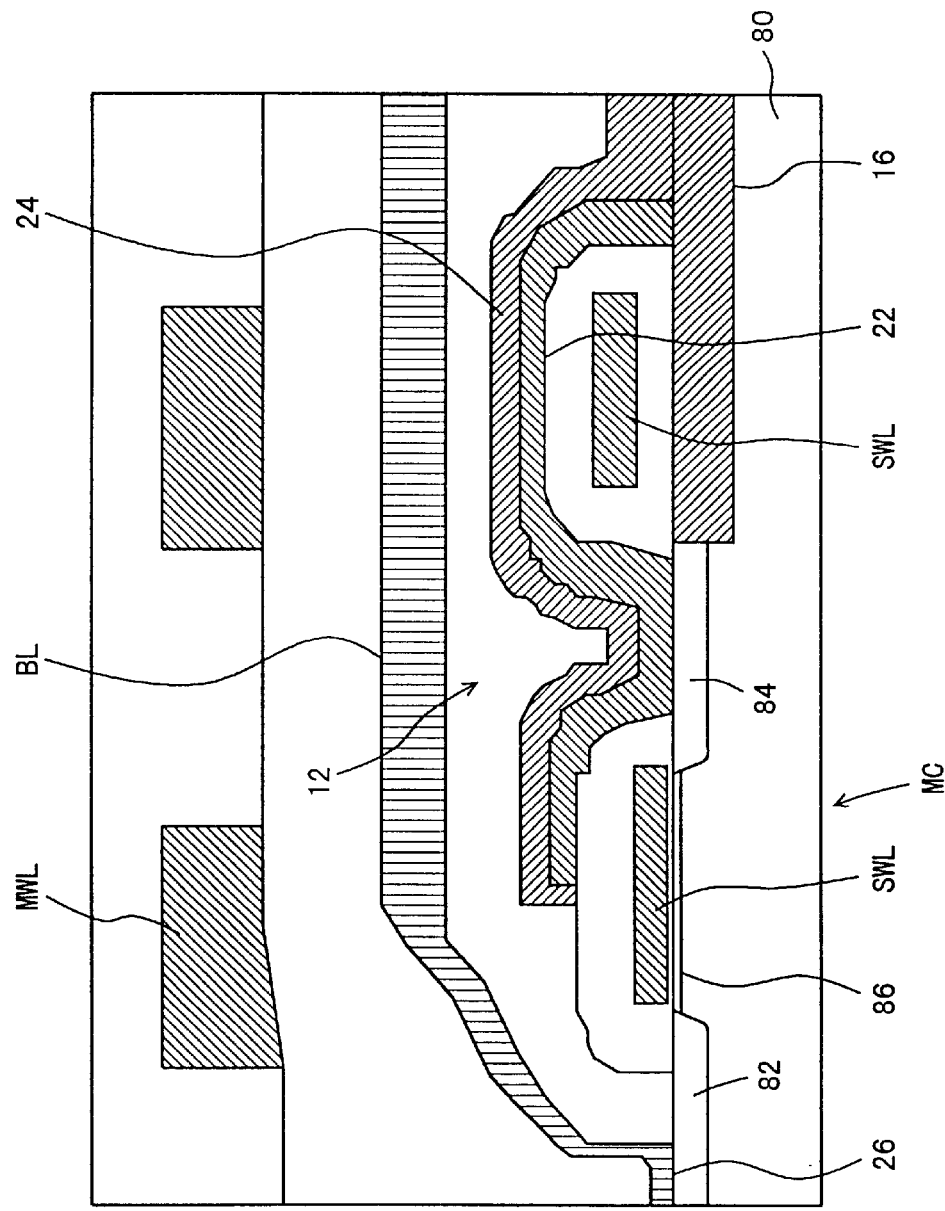
FIG. 19 is a sectional view showing a structure of a memory cell in a system LSI according to an eighth embodiment of the present invention.
Figure 20:
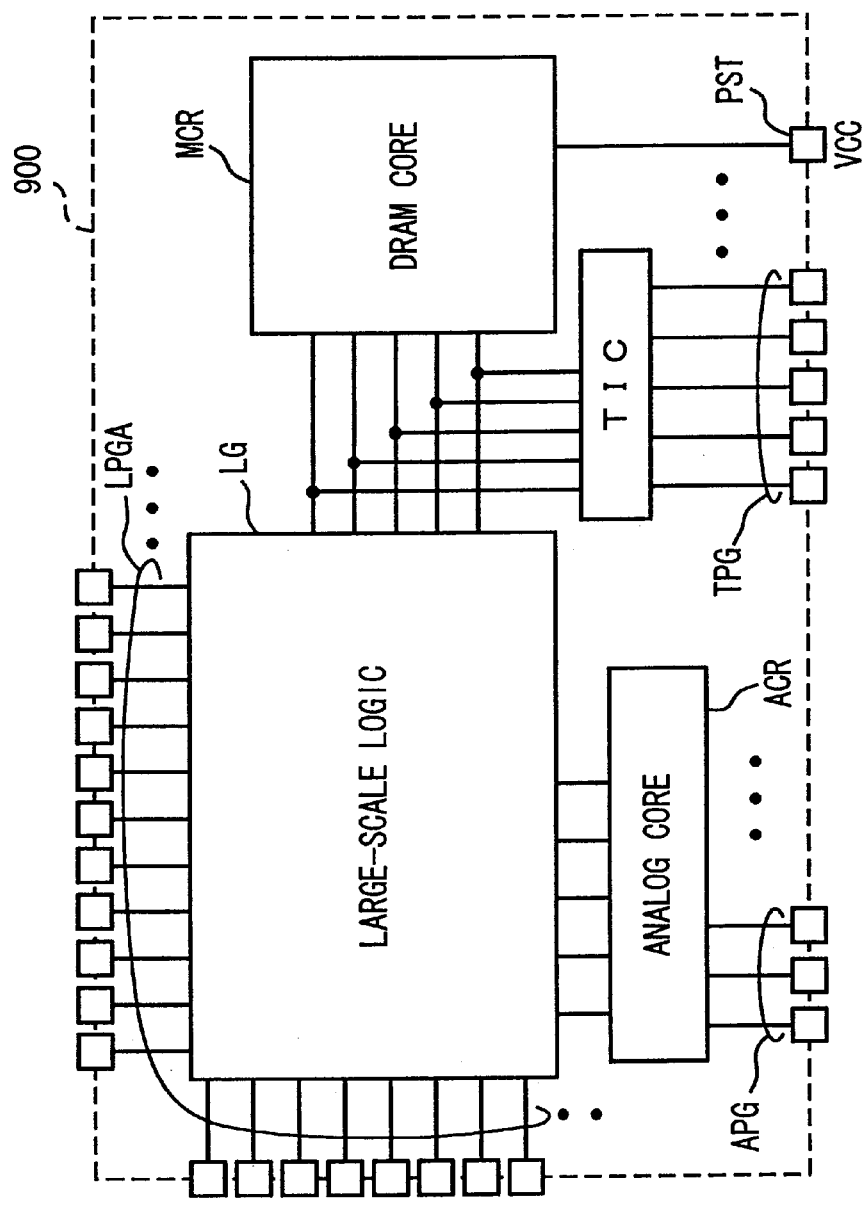
FIG. 20 is a block diagram showing the entire structure of a conventional system LSI.
Figure 21:
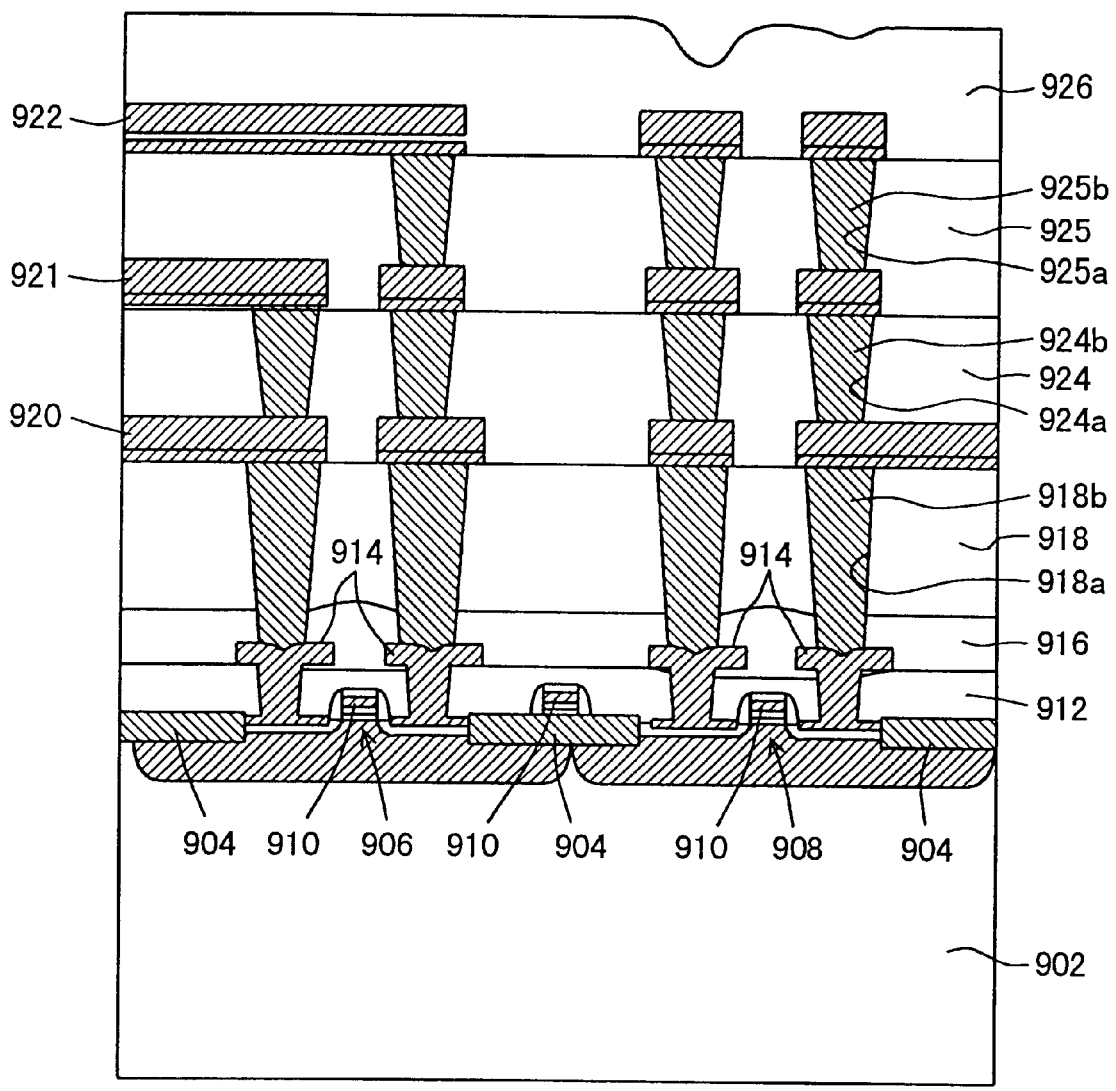
FIG. 21 is a sectional view showing a part of a structure of peripheries of a DRAM core and a large-scale logic illustrated in FIG. 20.

FIG. 19 is a sectional view showing a structure of a memory cell in a system LSI according to an eighth embodiment of the present invention. Unlike the structure shown in FIG. 2, an access transistor MC is formed of a P channel MOS transistor in the eighth embodiment. More specifically, on the surface of an N-type well 80, P⁺-type diffusion layers 82 and 84 are formed as source/drain regions of the access transistor MC. Here, under a gate electrode forming a sub-word line SWL, a P-type channel 86 is formed. Since hole is harder to diffuse than electron in general to cause less soft errors, a necessary capacitor capacity can be reduced.

Although the foregoing embodiments have been described with respect to application of the present invention to such a system LSI as a DRAM with a logic, the present invention is also applicable to common DRAMs.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in rows and columns, and a plurality of first and second folded bit line pairs arranged in said columns, wherein a field region of access transistors of said memory cells connected to one bit line pair and arranged in each said column is formed in a region bounded by two straight lines in a direction along each column, and two bit lines of each said folded bit line pair are formed in parallel to each other in each said column, wherein said field region of access transistors are aligned along bit lines.

2. The semiconductor memory device according to claim 1, wherein said memory cell includes a capacitor formed under said bit line pair.

3. The semiconductor memory device according to claim 1, wherein said memory cells and said folded bit line pairs constitute a bank, and said first or second sense amplifiers are shared by two adjacent banks.

4. The semiconductor memory device according to claim 1, wherein said memory cells have a ⅓ pitch cell arrangement.

5. The semiconductor memory device according to claim 1, further comprising:

a plurality of word lines, a plurality of first word drivers connected to one side of said plurality of word lines, and a plurality of second word drivers connected to the other side of said plurality of word lines.

6. A semiconductor memory device comprising:

a plurality of memory cells arranged in rows and columns, wherein each of said memory cells includes a capacitor formed under said folded bit line pair;

a plurality of first and second folded bit line pairs arranged in said columns, wherein a field region of access transistors of said memory cells connected to one bit line pair and arranged in each said column is formed in a region bounded by two straight lines in a direction along each column, and two bit lines of each said folded bit line pair are formed in parallel to each other in each said column, wherein said field region of access transistors are aligned along bit lines;

a plurality of first word lines connected to memory cells connected to said first folded bit line pair;

a plurality of second word lines connected to memory cells connected to said second folded bit line pair;

a plurality of first sense amplifiers arranged on one side of said plurality of first and second folded bit line pairs so as to correspond to said plurality of first folded bit line pairs and each connected to the corresponding first folded bit line pair;

a plurality of second sense amplifiers arranged on the other side of said plurality of first and second folded bit line pairs so as to correspond to said plurality of second folded bit line pairs and each connected to the corresponding second folded bit line pair; and a controller disposed to activate said first sense amplifier when said first word line is selected and activate said plurality of second sense amplifiers when said second word line is selected.

7. The semiconductor memory device according to claim 6, wherein said first and second folded bit line pairs are arranged alternately.

8. A semiconductor memory device comprising:

a plurality of memory cells arranged in rows and columns, wherein said memory cells have a ⅓ pitch cell arrangement;

a plurality of first and second folded bit line pairs arranged in said columns, wherein a field region of access transistors of said memory cells connected to one bit line pair and arranged in each said column is formed in a region bounded by two straight lines in a direction along each column, and two bit lines of each said folded bit line pair are formed in parallel to each other in each said column, wherein said field region of access transistors are aligned along bit lines;

a plurality of first word lines connected to memory cells connected to said first folded bit line pairs;

a plurality of second word lines connected to memory cells connected to said second folded bit line pairs;

a plurality of first sense amplifiers arranged on one side of said plurality of first and second folded bit line pairs so as to correspond to said plurality of first folded bit line pairs and each connected to the corresponding first folded bit line pair;

a plurality of second sense amplifiers arranged on the other side of said plurality of first and second folded bit line pairs so as to correspond to said plurality of second folded bit line pairs and each connected to the corresponding second folded bit line pair; and a controller disposed to activate said first sense amplifier when said first word line is selected and activate said plurality of second sense amplifiers when said second word line is to be selected, wherein said first and second folded bit line pairs are arranged alternately.

9. A semiconductor memory device comprising:

a plurality of memory cells arranged in rows and columns;

a plurality of first and second folded bit line pairs arranged in said columns, wherein a field region of access transistors of said memory cells connected to one bit line pair and arranged in each said column is formed in a region bounded by two straight lines in a direction along each column, and two bit lines of each said folded bit line pair are formed in parallel to each other in each said column, wherein said field region of access transistors are aligned along bit lines;

a plurality of first word lines connected to memory cells connected to said first folded bit line pair, a plurality of second word lines connected to memory cells connected to said second folded bit line pairs, a plurality of sense amplifiers arranged on one side of said plurality of first and second folded bit line pairs and each corresponding to first and second folded bit line pairs, and a plurality of bit line isolation gates corresponding to said plurality of sense amplifiers and when said first word line is selected, each gate for disconnecting the corresponding first folded bit line pair from the corresponding sense amplifier and connecting the corresponding second folded bit line pair to the corresponding sense amplifier and when the corresponding second word line is selected, disconnecting the corresponding second folded bit line pair from the corresponding sense amplifier and connecting the corresponding first folded bit line pair to the corresponding sense amplifier, wherein said memory cells and said folded bit line pairs constitute each bank.

10. The semiconductor memory device according to claim 9, wherein one bit line of said first folded bit line pair is arranged between one and the other bit lines of said second folded bit line pair.

* * * * *